US006759870B2

(12) United States Patent
Cliff et al.

(10) Patent No.: US 6,759,870 B2
(45) Date of Patent: *Jul. 6, 2004

(54) PROGRAMMABLE LOGIC ARRAY INTEGRATED CIRCUITS

(75) Inventors: Richard G. Cliff, Santa Clara, CA (US); Bahram Ahanin, Cupertino, CA (US); Craig Schilling Lytle, Palo Alto, CA (US); Francis B. Heile, Santa Clara, CA (US); Bruce B. Pedersen, Santa Clara, CA (US); Kerry Veenstra, Concord, CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/372,373

(22) Filed: Feb. 20, 2003

(65) Prior Publication Data

US 2003/0128052 A1 Jul. 10, 2003

Related U.S. Application Data

(63) Continuation of application No. 10/356,691, filed on Jan. 31, 2003, which is a continuation of application No. 09/935,792, filed on Aug. 22, 2001, now abandoned, which is a continuation of application No. 09/496,945, filed on Feb. 3, 2000, now abandoned, which is a continuation of application No. 09/179,254, filed on Oct. 26, 1998, now Pat. No. 6,064,599, which is a continuation of application No. 08/851,858, filed on May 6, 1997, now Pat. No. 5,848,005, which is a continuation of application No. 08/655,870, filed on May 24, 1996, now Pat. No. 5,668,771, which is a continuation of application No. 08/245,509, filed on May 18, 1994, now Pat. No. 5,550,782, which is a continuation-in-part of application No. 08/111,693, filed on Aug. 25, 1993, now Pat. No. 5,436,575, which is a continuation-in-part of application No. 07/880,942, filed on May 8, 1992, now Pat. No. 5,260,611, and a continuation-in-part of application No. 07/754,017, filed on Sep. 3, 1991, now Pat. No. 5,260,610.

(51) Int. Cl.$^7$ ............................................ H03K 19/177
(52) U.S. Cl. ............................................ 326/41; 326/38
(58) Field of Search ........................................ 326/37–41

(56) References Cited

U.S. PATENT DOCUMENTS 3,473,160 A 10/1969 Wahlstrom .................. 326/41

(List continued on next page.)

FOREIGN PATENT DOCUMENTS

EP 0081917 8/1983

(List continued on next page.)

OTHER PUBLICATIONS

Masumoto, Rodney T., "Configurable On–Chip RAM Incorporated into High Speed Logic Array," IEEE Custom Integrated Circuits Conference, Jun. 1985, CH2157–6/85/0000–0240, pp. 240–243.

(List continued on next page.)

*Primary Examiner*—Don Le
(74) *Attorney, Agent, or Firm*—Fish & Neave; Robert R. Jackson; Hong S. Lin

(57) ABSTRACT

A programmable logic array integrated circuit has a number of programmable logic modules which are grouped together in a plurality of logic array blocks ("LABs"). The LABs are arranged on the circuit in a two dimensional array. A conductor network is provided for interconnecting any logic module with any other logic module. In addition, adjacent or nearby logic modules are connectable to one another for such special purposes as providing a carry chain between logic modules and/or for connecting two or more modules together to provide more complex logic functions without having to make use of the general interconnection network. Another network of so-called fast or universal conductors is provided for distributing widely used logic signals such as clock and clear signals throughout the circuit. Multiplexers can be used in various ways to reduce the number of programmable interconnections required between signal conductors.

51 Claims, 19 Drawing Sheets

U.S. PATENT DOCUMENTS

| | | | |
|---|---|---|---|
| 4,020,469 A | 4/1977 | Manning | 326/40 |
| 4,124,899 A | 11/1978 | Birkner et al. | 326/40 |
| 4,203,159 A | 5/1980 | Wanlass | 365/222 |
| 4,293,783 A | 10/1981 | Patil | 326/40 |
| 4,398,267 A | 8/1983 | Furuyama | 365/182 |
| 4,409,683 A | 10/1983 | Woodward | 370/537 |
| 4,609,986 A | 9/1986 | Hartmann et al. | 326/45 |
| 4,617,479 A | 10/1986 | Hartmann et al. | 365/185.17 |
| 4,642,487 A | 2/1987 | Carter | 326/41 |
| 4,677,318 A | 6/1987 | Veenstra | 326/40 |
| 4,689,654 A | 8/1987 | Brockmann | 257/209 |
| 4,706,216 A | 11/1987 | Carter | 365/44 |
| 4,713,792 A | 12/1987 | Hartmann et al. | 711/103 |
| 4,745,579 A | 5/1988 | Mead et al. | 365/104 |
| 4,758,745 A | 7/1988 | Elgamal et al. | 326/16 |
| 4,758,985 A | 7/1988 | Carter | 365/94 |
| 4,774,421 A | 9/1988 | Hartmann et al. | 365/185.17 |
| 4,783,606 A | 11/1988 | Goetting | 326/44 |
| 4,786,904 A | 11/1988 | Graham, III et al. | 326/38 |
| 4,818,902 A | 4/1989 | Brockmann | 326/38 |
| 4,818,988 A | 4/1989 | Cooperman et al. | 340/2.29 |
| 4,825,414 A | 4/1989 | Kawata | 365/189.05 |
| 4,831,591 A | 5/1989 | Imazeki et al. | 365/189.08 |
| 4,835,418 A | 5/1989 | Hsieh | 326/57 |
| 4,847,612 A | 7/1989 | Kaplinsky | 326/10 |
| 4,855,619 A | 8/1989 | Hsieh et al. | 326/44 |
| 4,855,958 A | 8/1989 | Ikeda | 365/230.08 |
| 4,870,302 A | 9/1989 | Freeman | 326/41 |
| 4,871,930 A | 10/1989 | Wong et al. | 326/39 |
| 4,873,459 A | 10/1989 | El Gamal et al. | 326/41 |
| 4,879,481 A | 11/1989 | Pathak et al. | 326/46 |
| 4,899,067 A | 2/1990 | So et al. | 326/38 |
| 4,912,342 A | 3/1990 | Wong et al. | 326/40 |
| 4,912,345 A | 3/1990 | Steele et al. | 326/39 |
| 4,937,475 A | 6/1990 | Rhodes et al. | 326/41 |
| 4,963,768 A | 10/1990 | Agrawal et al. | 326/38 |
| 4,963,770 A | 10/1990 | Keida | 326/40 |
| 4,975,601 A | 12/1990 | Steele | 326/38 |
| 5,015,884 A | 5/1991 | Agrawal et al. | 326/39 |
| 5,023,484 A | 6/1991 | Pathak et al. | 326/46 |
| 5,027,011 A | 6/1991 | Steele | 326/40 |
| 5,042,004 A | 8/1991 | Agrawal et al. | 712/243 |
| 5,073,729 A | 12/1991 | Greene et al. | 326/47 |
| 5,089,993 A | 2/1992 | Neal et al. | 365/63 |
| 5,099,150 A | 3/1992 | Steele | 326/39 |
| 5,121,006 A | 6/1992 | Pedersen | 326/38 |
| 5,122,685 A | 6/1992 | Chan et al. | 326/41 |
| 5,128,559 A | 7/1992 | Steele | 326/38 |
| 5,144,166 A | 9/1992 | Camarota et al. | 326/41 |
| 5,144,582 A | 9/1992 | Steele | 365/189.08 |
| 5,191,243 A | 3/1993 | Shen et al. | 326/37 |
| 5,204,556 A | 4/1993 | Shankar | 326/41 |
| 5,212,652 A | 5/1993 | Agrawal et al. | 326/41 |
| 5,220,214 A | 6/1993 | Pedersen | 326/46 |
| 5,241,224 A | 8/1993 | Pedersen et al. | 326/41 |
| RE34,444 E | 11/1993 | Kaplinsky | 326/39 |
| 5,258,668 A | 11/1993 | Cliff et al. | 326/41 |
| 5,260,610 A | 11/1993 | Pedersen et al. | 326/41 |
| 5,260,611 A | 11/1993 | Cliff et al. | 326/39 |
| 5,313,119 A | 5/1994 | Cooke et al. | 326/41 |
| 5,315,178 A | 5/1994 | Snider | 326/44 |
| 5,329,460 A | 7/1994 | Agrawal et al. | 716/16 |
| 5,343,406 A | 8/1994 | Freeman et al. | 716/16 |
| 5,350,954 A | 9/1994 | Patel | 326/39 |
| 5,352,940 A | 10/1994 | Watson | 326/44 |
| 5,371,422 A | 12/1994 | Patel et al. | 326/41 |
| 5,408,434 A | 4/1995 | Stansfield | 365/189.08 |
| 5,414,377 A | 5/1995 | Freidin | 326/41 |
| 5,426,378 A | 6/1995 | Ong | 326/39 |
| 5,436,575 A | 7/1995 | Pedersen et al. | 326/40 |
| 5,504,875 A | 4/1996 | Mills et al. | 711/171 |
| 5,506,517 A | 4/1996 | Tsui et al. | 326/39 |
| 5,550,782 A | 8/1996 | Cliff et al. | 365/230.03 |
| 5,668,771 A | 9/1997 | Cliff et al. | 365/230.03 |
| 5,809,281 A | 9/1998 | Steele et al. | 711/170 |
| 5,835,405 A | 11/1998 | Tsui et al. | 365/182 |

FOREIGN PATENT DOCUMENTS

| | | |
|---|---|---|
| EP | 0340890 B1 | 11/1989 |
| EP | 0358501 A | 3/1990 |
| EP | 0410759 A2 | 1/1991 |
| EP | 0415542 A2 | 3/1991 |
| EP | 0420389 A1 | 4/1991 |
| EP | 0426283 A2 | 5/1991 |
| EP | 0450811 A2 | 10/1991 |
| EP | 0461798 B1 | 12/1991 |
| EP | 0507507 A2 | 10/1992 |
| EP | 0530985 A2 | 3/1993 |
| EP | 0569137 A2 | 11/1993 |
| EP | 0340891 B1 | 11/1994 |
| GB | 1444084 | 7/1976 |
| GB | 2202355 A | 9/1988 |
| JP | 58057825 | 4/1983 |
| JP | 01091525 A | 4/1989 |
| JP | 01091526 A | 4/1989 |
| WO | WO 90/04233 | 4/1990 |
| WO | WO 92/17001 | 10/1992 |
| WO | WO 94/10754 | 5/1994 |
| WO | WO 95/16993 | 6/1995 |

OTHER PUBLICATIONS

Landry, Steve, "Application–Specific ICs, Relying on RAM, Implement Almost Any Logic Function," Electronic Design, Oct. 31, 1985, pp. 123–130.

Bursky, Dave, "Shrink Systems with One–Chip Decoder, EPROM and RAM," Electronic Design, Jul. 28, 1988, pp. 91–94.

Kawana, Keiichi et al., "An Efficient Logic Block Interconnect Architecture for User–Reprogrammable Gate Array," IEEE 1990 Custom Integrated Circuits Conf., May 1990, CH2860–5/90/0000–0164, pp. 31.3.1–31.3.4.

Shubat, Alexander et al., "A Family of User–Programmable Peripherals with a Functional Unit Architecture," IEEE Jor. Of Solid–State Circuits, vol. 27, No. 4, Apr. 1992, 0018–9200/92S03.00, pp. 515–529.

"AT&T's Orthogonal ORCA Targets the FPGA Future," 8029 Electronic Engineering, 64, No. 786, Jun. 1992, pp. 9–10.

Bursky, Dave, "FPGA Advances Cut Delays, Add Flexibility," 2328 Electronic Design, 40, No. 20, Oct. 1, 1992, pp. 35–43.

Smith, Daniel, "Intel's FLEXlogic FPGA Architecture," IEEE Trans. on Computers 1063–6390/93, 1993, pp. 378–384.

Bursky, Dave, "Denser, Faster RPGAs Vie for Gate–Array Applications," 2328 Electronic Design, 41, No. 11, May 27, 1993, pp. 55–75.

Ngai, Kai–Kit Tony, "An SRAM–Programmable Field–Reconfigurable Memory," Presentation at University of Toronto, Canada, Jun. 1993, pp. 1–14.

Kautz, "Cellular Logic in Memory Arrays," IEEE Trans. on Computers, vol. C–18, No. 8, Aug. 1969, pp. 719–727.

Stone, "A Logic in Memory Computer," IEEE Trans. on Computers, Jan. 1970, pp. 73–78.

Manning, "An Approach to Highly Integrated Computer Maintained Cellular Arrays," IEEE Trans. on Computers, vol. C–26, No. 6, Jun. 1977, pp. 536–552.

Patil et al., "A Programmable Logic Approach for VLSI," IEEE Trans. on Computers, vol. C–28, No. 9, Sep. 1979, pp. 594–601.

Seitz, "Concurrent VLSI Architectures," IEEE Trans. on Computers, vol. C–33, No. 12, Dec. 1984, pp. 1247–1265.

Hsieh et al., "Third Generation Architecture Boosts Speed and Density of Field Programmable Gate Arrays," Proc. Of IEEE CICC Conf., May 1990, pp. 31.2.1–31.2.7.

Bursky, "Combination RAM/PLD Opens New Application Options," Electronic Design, May 23, 1991, pp. 138–140.

Ling et al., "WASMII: A Data Driven Computer on a Virtual Hardware," Proc. of IEEE Field Prog. Custom Computing Machines Conf., Napa, California, Apr. 1993, pp. 33–42.

Casselman, "Virtual Computing and The Virtual Computer," IEEE, Jul. 1993, pp. 43–48.

Quenot et al., "A Reconfigurable Compute Engine for Real–Time Vision Automata Prototyping," Proc. of IEEE FCCM Conf., Napa, California, Feb. 1994, pp. 91–100.

Plus Logic, "FPSL5110 Intelligent Data Buffer," Product Brief, Plus Logic, Inc., San Jose, California, Oct. 1990, pp. 1–6.

Larsson, T., "Programmabel Logic Circuits: The Luxury Alternatives are Coming Soon," Elteknik–med–Aktuell Electronik, No. 4, Feb. 25, 1988–Mar. 9, 1988, pp. 37–38. (with English abstract).

Intel Preliminary Datasheet, "iFX780: 10ns FLEXlogic FPGA with SRAM Option," Nov. 1993, pp. 2–24 to 2–46.

Quinnell, Richard A., "FPGA Family Offers Speed, Density, On–Chip RAM, and Wide–Decode Logic," EDN, Dec. 6, 1990, pp. 62–64.

Satoh, Hisayasu et al., "A 209K–Transistor ECL Gate Array with RAM," IEEE Jor. of Solid–State Circuits, vol. 24, No. 5, Oct. 1989, pp. 1275–1279.

"Optimized Reconfigurable Cell Array (ORCA) Series Field–Programmable Gate Arrays," AT&T Microelectronics, Data Sheet, Mar. 1994, pp. 1–100.

"Optimized Reconfigurable Cell Array (ORCA) Series Field–Programmable Gate Arrays," AT&T Microelectronics, Preliminary Data Sheet, Apr. 1994, pp. 1–104.

"The Programmable Gate Array Data Book," Xilinx, Inc., 1988, pp. 1–1 to 2–123.

"The Programmable Logic Data Book," Xilinx, Inc., 1993.

"The Programmable Logic Data Book," Xilinx, Inc., 1994, pp. 2–1 to 2–102.

Prince et al., Semiconductor Memories, 2nd Ed., 1991, pp. 149–151, 157–160, and 371–375.

Bennett, P.S. et al., "BiCMOS Technology in Gate Arrays with Configurable RAM," Proc. of 7th International Conf. on Custom and Semicustom ICs, Nov. 3–5, 1987, London, U.K., pp. 54/1–7.

Brinkman, "Evolution of the Logic Cell Array," Elektronica, vol. 38, No. 17, Sep. 7, 1990, pp. 43–53.

Britton et al., "Optimized Reconfigurable Cell Array Architecture for High–Performance Field Programmable Gate Arrays," in IEEE 1993 Custom Integrated Circuits Conference.

Cliff et al., "A Dual Granularity and Globally Interconnected Architecture for a Probrammable Logic Device," in IEEE 1993 Custom Integrated Circuits Conference.

Conner, "PLD Architectures Require Scrutiny," in Electrical Design News, vol. 34, No. 20, Sep. 28, 1989, pp. 91, 93, 94, 96, 98, 100.

Furtek, "Labyrinth: A Homogeneous Computational Medium," in IEEE 1990 Custom Integrated Circuits Conference.

Hallau, "More Than Mere 'Gate Logic'," in Electronik, vol. 40, No. 15, Jul. 23, 1991, pp. 95–99.

Marple, "An MPGA Compatible FPGA Architecture," in IEEE 1992 Custom Integrated Circuits Conference.

Miyahara et al., "A Composite CMOS Gate Array with 4K RAM and 128K ROM," in Proceedings of the IEEE 1985 Custom Integrated Circuits Conference, pp. 248–251.

*New IEEE Standard Dictionary of Electrical and Electronics Terms*, 5th Edition, Jan. 15, 1993, p. 974.

Ramatschi, "Field–Programmable Integrated Circuits," in Elecktronik Praxis, vol. 25, No. 19, Oct. 4, 1990, pp. 52–59.

Sano et al., "A 20ns CMOS Functional Gate Array with a Configurable Memory," in Proceedings of the 1983 IEEE International Solid State Circuits Conference.

Spandorfer, "Synthesis of Logic Functions on an Array of Integrated Circuits," Final Report prepared for Air Force Cambridge Research Laboratories, Office of Aerospace Research, United States Air Force, 1965.

Sugo et al., "An ECL 2.8ns 16K RAM with 1.2K Logic Gate Array," IEEE International Solid–State Circuits Conference, Feb. 21, 1986, pp. 256–257.

Takechi et al., "A CMOS 12K–Gate Array with Flexible 10Kb Memory," in Proceedings of the 1984 IEEE International Solid–State Circuits Conference, p. 258.

Weiss, "FPGA Targets Dynamically Reloadable Logic," in Electrical Digest News, Mar. 17, 1994.

Weiss, "Intel CPLD Combines Flash Memory, SRAM–Based Logic," in Electrical Digest News, Apr. 28, 1994.

Freeman, R.H., "XC3000 Family of User–Programmable Gate Arrays," Microprocessors and Microsystems, vol. 13, No. 5, Jun. 1, 1989, pp. 313–320.

Yau, S.S. et al., "Universal Logic Modules and Their Applications," IEEE Trans. on Computers, vol. C–19, No. 2, Feb. 1970, pp. 141–149.

Minnick, R.C., "A Survey of Microcellular Research," Journal of the Association for Computing Machinery, vol. 14, No. 2, Apr. 1967, pp. 203–241.

Wahlstrom, S.E., "Programmable Logic Arrays—Cheaper by the Millions," Electronics, Dec. 11, 1967, pp. 90–95.

Shoup, Richard G., Programmable Cellular Logic Arrays (1970) (Ph.D dissertation, Carnegie Mellon University (Pittsburgh)).

Carr et al., *MOS/LSI Design and Application*, Texas Instruments Electronics Series, McGraw–Hill and Co., 1972, pp. 229–258.

Heutink, F., "Implications of Busing for Cellular Arrays," Computer Design, Nov. 1974, pp. 95–100.

Fleisher, H. et al., "An Introduction to Array Logic," IBM Journal of Research and Development, Mar. 1975, pp. 98–109.

Horninger, K., "A High–Speed ESFI SOS Programmable Logic Array with an MNOS Version," IEEE Journal of Solid State Circuits, vol. SC–10, No. 5, Oct. 1975, pp. 331–336.

Kitson, B. et al., "Programmable Logic Chip Rivals Gate Arrays in Flexibility," Electronic Design, Dec. 8, 1983, pp. 95–101.

Advanced Micro Devices, "The World's Most Versatile Logic Tool; AmPAL22V10," May 1984.

Monolithic Memories, "Programmable Array Logic; PAL 20RA10," Jun. 1984.

Haines, A., "Field–Programmable Gate Array with Non–Volatile Configuration," Microprocessors and Microsystems, vol. 13, No. 5, Jun. 1989.

El–Ayat, K.A. et al., "A CMOS Electronically Configurable Gate Array," IEEE Journal of Solid State Circuits, vol. 24, No. 3, Jun. 1989.

Ahrens, M. et al., "An FPGA Family Optimized for High Densities and Reduced Routing Delay," Proc. IEEE 1990 Custom Integrated Circuits Conference.

Knapp, S.K., "Optimizing Programmable Gate Array Designs," 8080 WESCON 88/Conference Record 32 (1988) Nov. North Hollywood, CA,US, XILINX, Inc.

PROGRAMMABLE LOGIC ARRAY INTEGRATED CIRCUITS

This is a continuation of application Ser. No. 10/356,691, filed Jan. 31, 2003, which is a continuation of application Ser. No. 09/935,792, filed Aug. 22, 2001 (now abandoned), which is a continuation of application Ser. No. 09/496,945, filed Feb. 3, 2000 (now abandoned), which is a continuation of application Ser. No. 09/179,254, filed Oct. 26, 1998 (now U.S. Pat. No. 6,064,599), which is a continuation of application Ser. No. 08/851,858, filed May 6, 1997 (now U.S. Pat. No. 5,848,005), which is a continuation of application Ser. No. 08/655,870, filed May 24, 1996 (now U.S. Pat. No. 5,668,771), which is a continuation of application Ser. No. 08/245,509, filed May 18, 1994 (now U.S. Pat. No. 5,550,782), which is a continuation-in-part of application Ser. No. 08/111,693, filed Aug. 25, 1993 (now U.S. Pat. No. 5,436,575), which is a continuation-in-part of application Ser. No. 07/880,942, filed May 8, 1992 (now U.S. Pat. No. 5,260,611) and application Ser. No. 07/754,017, filed Sep. 3, 1991 (now U.S. Pat. No. 5,260,610).

BACKGROUND OF THE INVENTION

This invention relates to programmable logic array integrated circuits, and more particularly to programmable logic array integrated circuits with improved arrangements of the programmable logic elements and improved interconnections between those elements.

Programmable logic arrays are known in which substantial numbers of relatively elementary individual programmable logic elements are provided in a two-dimensional array. The array also includes a grid of intersecting signal conductors for conducting logic signals to, from, and between the programmable logic elements. Such programmable logic arrays are shown, for example, in Carter U.S. Pat. Nos. 4,642,487, 4,706,216, and 4,758,985, and in Freeman U.S. Pat. No. 4,870,302.

As integrated circuit fabrication techniques progress, it becomes possible to put more and more programmable logic elements on a chip. As the number of elements increases, it becomes important to improve the techniques used to interconnect them. For example, it is important to provide enough interconnection pathways between the programmable logic elements so that the capabilities of those elements can be fully utilized and so that complex logic functions (requiring concatenation of programmable logic elements) can be performed, without providing so many such pathways that there is a wasteful excess of this type of resource. Similarly, as the number of programmable elements increases, the complexity of the logic which can be performed also increases. But this in turn tends to increase the complexity of the task of programming the circuit unless additional logical structure is included in the circuit to help correspondingly structure the programming task.

There is always room for further improvement, however, and there are some situations in which the provision of additional or alternative types of interconnections between the logic modules would have benefits sufficient to justify the additional circuit and programming complexity. Such additional interconnection paths may be desirable for making frequently needed kinds of interconnections, for speeding certain kinds of interconnections, for allowing short distance connections to be made without tying up more general purpose and therefore long distance interconnection resources, etc. There is also a continuing demand for logic devices with larger capacity. This produces a need to implement logic functions more efficiently and to make better use of the portion of the device which is devoted to interconnecting individual logic modules.

It is therefore an object of this invention to provide improved programmable logic array integrated circuits.

It is a more particular object of this invention to provide programmable logic array integrated circuits with additional possibilities for interconnections between the logic modules.

It is a further object of this invention to provide improved techniques for organizing and interconnecting the programmable logic elements in programmable logic array integrated circuits.

Finally, another object of this invention is to provide improved programmable logic array integrated circuits.

SUMMARY OF THE INVENTION

These and other objects of the invention are accomplished in accordance with the principles of the invention by providing programmable logic array integrated circuits in which signal conductors are interconnected not by relatively large and complex programmable interconnections, but by relatively small and simple fixed interconnections to multiplexers which can then be programmed to effect the desired interconnections. Instead of having a signal conductor which crosses several other signal conductors programmably connectable to each of those other conductors by programmable elements at or near the intersection, a simple non-programmable transverse connection is made to each of those other conductors, and the transverse connections are applied in parallel to a multiplexer. The multiplexer can then be programmed to select one of its inputs as its output. The output of the multiplexer can be an input to a programmable logic element, an output from the integrated circuit, or a lead which is programmably connectable to one or more of several other conductors in the device.

Another interconnection technique which can be advantageously employed in accordance with the principles of this invention is to group the programmable logic elements into a plurality of mutually exclusive groups, each group having associated with it one or more conductors which can only be used to interconnect the elements in that group. In addition, there are other conductors which can be used to convey signals between the groups. Grouping the programmable logic elements in mutually exclusive (i.e., non-overlapping) groups helps to simplify the task of programming the device by breaking the device down into several discrete parts, each of which is smaller and more easily managed than the whole device. Providing signal conductors which serve only to interconnect the programmable logic elements in each group avoids tying up much longer conductors just to make short interconnections between adjacent programmable logic elements. This helps to reduce the required number of long conductors.

In the above-described arrangement in which the programmable logic elements are grouped and each group is uniquely associated with certain interconnection signal conductors, each programmable logic element may be augmented with a programmable output stage which can be used either to feed the output of that programmable logic element to conductors which go beyond the associated group or to the interconnect conductors of the associated group.

Multiplexers can also be used in combination with programmable signal conductor interconnections to allow certain of the conductors to be laid down more densely, to reduce the size of the interconnection array, and to reduce the capacitive loading on each output conductor of the array.

Instead of one output conductor crossing a large number of parallel input conductors with a programmable interconnection at each intersection of the output conductor with the input conductors (which tends to force relatively wide spacing of the input conductors because of the relatively large size of the programmable interconnections), two substantially parallel output conductors feeding a programmably controlled output multiplexer are used. Each of these output conductors has a programmable interconnection only with every other one of the input conductors, and the input conductors which are thus connectable to one of the output conductors are interdigitated with the input conductors which are connectable to the other one of the output conductors. By thus spreading the programmable interconnections somewhat parallel to the longitudinal axes of the input conductors, the input conductors can be placed more closely together, which may save valuable space on the integrated circuit. This technique can also be used and further enhanced to reduce the number of programmable elements required to control the programmable interconnections between the input and output conductors if desired. In particular, a single programmable element can be used to control two interconnections, one of which is on one output conductor, and the other of which is on the other output conductor. The output multiplexer then makes the final selection of the desired output signal. Reducing the number of programmable elements in this way may be especially beneficial when the programmable elements are relatively large (e.g., as compared to the signal conductor interconnection elements they control). Indeed, it may be desirable to use more than two output signal conductors feeding the programmably controlled output multiplexer and to have each programmable element control one interconnection element on each of the more than two output conductors to still further reduce the required number of programmable elements.

Furthermore, other objects of the invention are accomplished in accordance with the principles of this invention by providing programmable logic array integrated circuits which basically employ a highly modular structure of logic elements and logic element interconnection pathways, but which also have one or more of several types of additional interconnection pathways for such purposes as making interconnections locally without tying up resources in the general interconnection structure. For example, such local interconnections may include carry chain interconnections between adjacent or nearby logic modules, or cascade logic connections between such modules in order to allow concatenation of the logic in those modules without recourse to the general interconnection structure. Where, as is preferred, the logic modules are grouped in logic array blocks ("LABS") which are in turn arranged on the integrated circuit in rows and columns, these additional local interconnections may not only be provided between logic modules within a LAB, but also to logic modules in the LABs in another (typically adjacent) row and/or column.

In embodiments employing a network of so-called global horizontal and vertical conductors, interconnections between those conductors are preferably made through tri-state drivers rather than mere passive connections in order to boost signals which may be required to travel relatively long distances through the circuit. Such drivers may alternatively or in addition be used on all logic module output signals which drive relatively long conductors on the circuit.

In addition to the network of global horizontal and vertical conductors typically used for making interconnections between all but relatively closely adjacent logic modules and connections to most of the input and output terminals of the circuit, another auxiliary network of horizontal and vertical conductors (so-called universal fast conductors) may be provided for distributing certain widely used logic signals such as clock and clear signals throughout the circuit. For example, conductors in this universal fast conductor network may be connectable to every logic module in the circuit.

Further features of the invention, its nature and various advantages will be more apparent from the accompanying drawings and the following detailed description of the preferred embodiments.

DESCRIPTION OF THE INVENTION
First Embodiment

Figure 1:
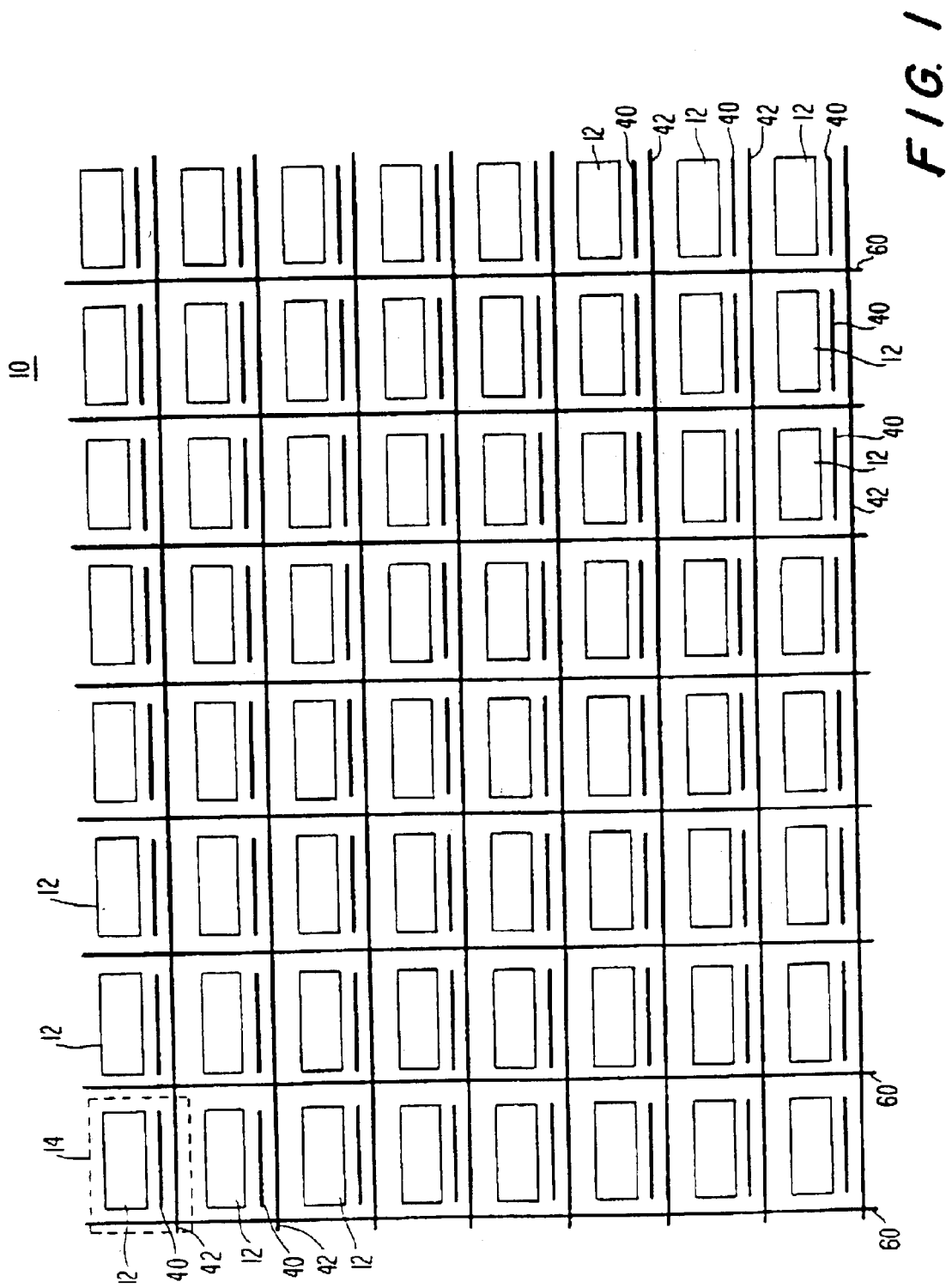
FIG. 1 is a simplified block diagram of a programmable logic array integrated circuit constructed in accordance with the principles of this invention.
Figure 2:
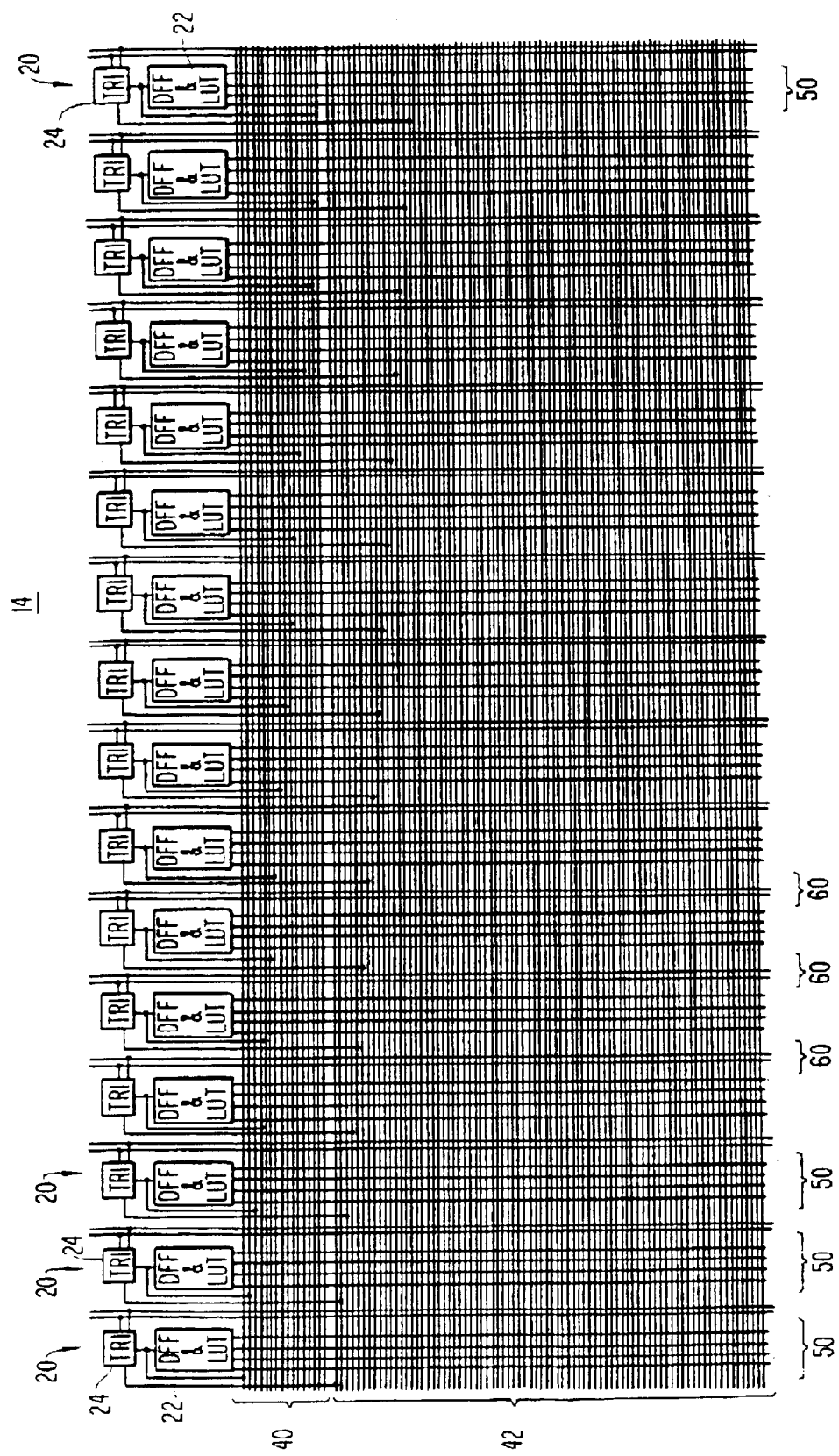
FIG. 2 is a more detailed block diagram of a representative portion of the circuit of FIG. 1.

As shown in FIG. 1, an illustrative programmable logic array integrated circuit 10 constructed in accordance with the first embodiment of the present invention includes a two-dimensional array of groups 12 of programmable logic elements. The representative portion of FIG. 1 which is surrounded by broken line 14 and which includes a typical group 12 is shown in more detail in FIG. 2. The structure shown in FIG. 2 is sometimes referred to herein as a logic array block or LAB. Accordingly, integrated circuit 10 (FIG. 1) is an eight by eight two-dimensional array of 64 LABs 14.

Figure 3:
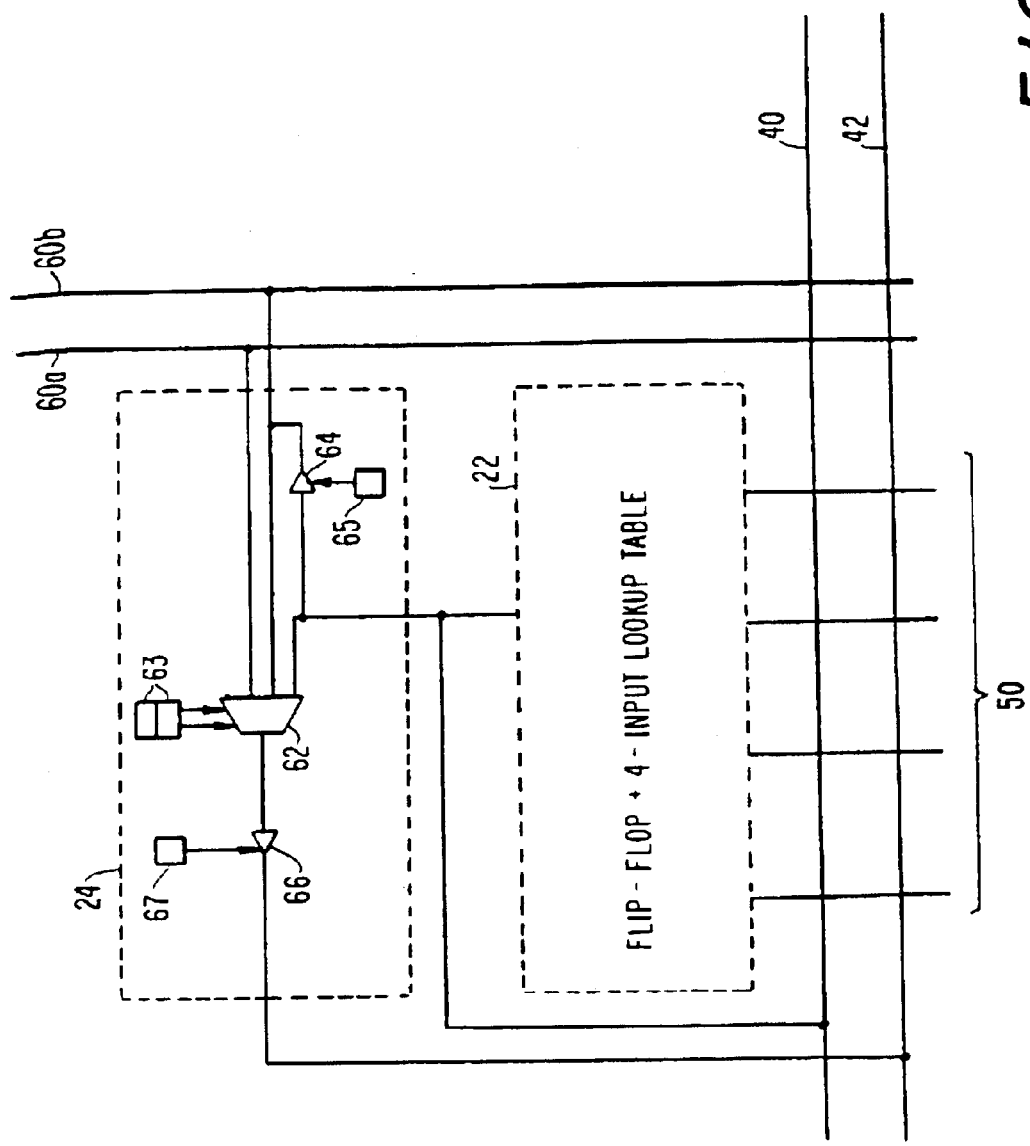
FIG. 3 is a still more detailed schematic block diagram of a representative portion of FIG. 2.
Figure 4:
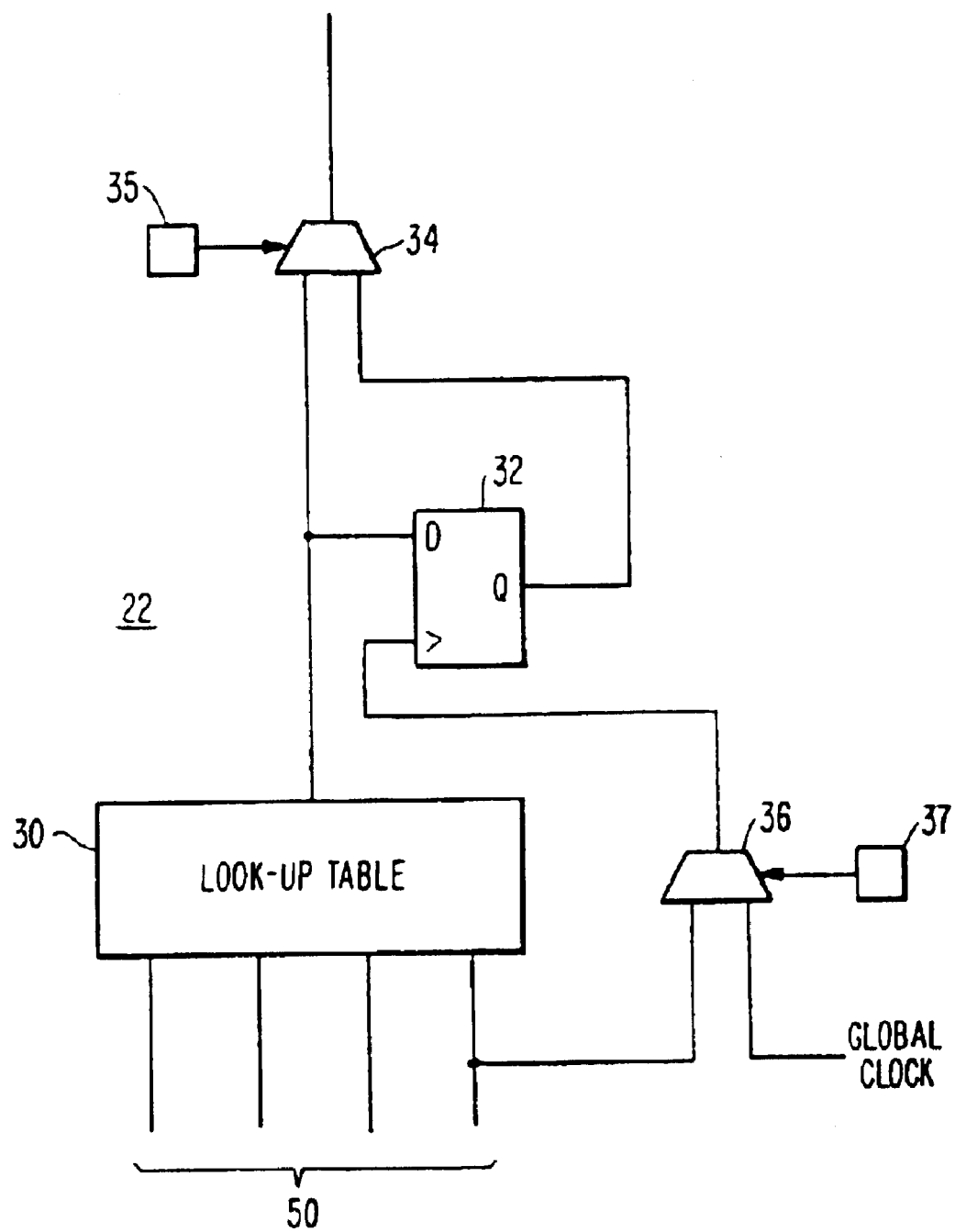
FIG. 4 is a schematic block diagram showing a portion of FIG. 3 in still more detail.

As can be seen in FIG. 2, each LAB 14 includes 16 programmable logic elements or macrocells 20, a representative one of which is shown in more detail in FIG. 3. In particular, although other types of logic elements could be used instead, in the illustrative embodiment shown in FIG. 3 each programmable logic element 20 includes a D-type flip-flop and four-input look-up table element 22 (shown in more detail in FIG. 4) and tri-state driver logic 24. As shown in FIG. 4, each element 22 includes a four-input look-up table 30 which is programmable to produce a desired binary output signal value for each of the 16 possible combinations of its four binary input signals. The output signal of look-up table 30 is applied to multiplexer 34 both directly and via D-type flip-flop 32. Flip-flop 32 can be clocked by either of the signals applied to multiplexer 36, i.e., by either a global clock signal or by one of the inputs to look-up table 30. Multiplexers 34 and 36 are controlled by conventional programmable elements 35 and 37 (e.g., RAM, EPROM, EEPROM, fuse, or antifuse elements). Returning to FIG. 1, each LAB 14 has a plurality of signal conductors 40 (e.g., one for each of the programmable logic elements 20 in that LAB) which can be used to convey signals only between the programmable logic elements in that LAB (see also FIG. 2). Accordingly, the conductors 40 associated with each LAB are uniquely associated with that LAB and do not extend beyond that LAB. In addition, a plurality of signal conductors 42 is associated with each horizontal row of LABs 14. These signal conductors can be used to convey signals between LABS in the associated horizontal row of LABs. For example, 80 such conductors 42 may be provided for each horizontal row of LABS. This is less than the number of programmable logic elements in each horizontal row, so some of conductors 42 are connected to the outputs of two programmable logic elements. In addition to the above-described horizontal signal conductors, there are two types of vertical signal conductors other than those which have already been discussed. The first of these provide the four inputs to the look-up table 30 in each programmable logic element 20. These conductors are not shown in FIG. 1, but are identified by the reference number 50 in the other FIGS. These conductors do not go outside the LAB of the associated programmable logic element. They allow the associated programmable logic element to receive input signals from the conductors 40 in the associated LAB and/or from the conductors 42 which pass through the associated LAB. Each conductor 50 may be programmably interconnectable to some or all of the horizontal conductors 40 and 42 that it crosses. Only one of the possible interconnections will generally be made at any one time.

Figure 6:
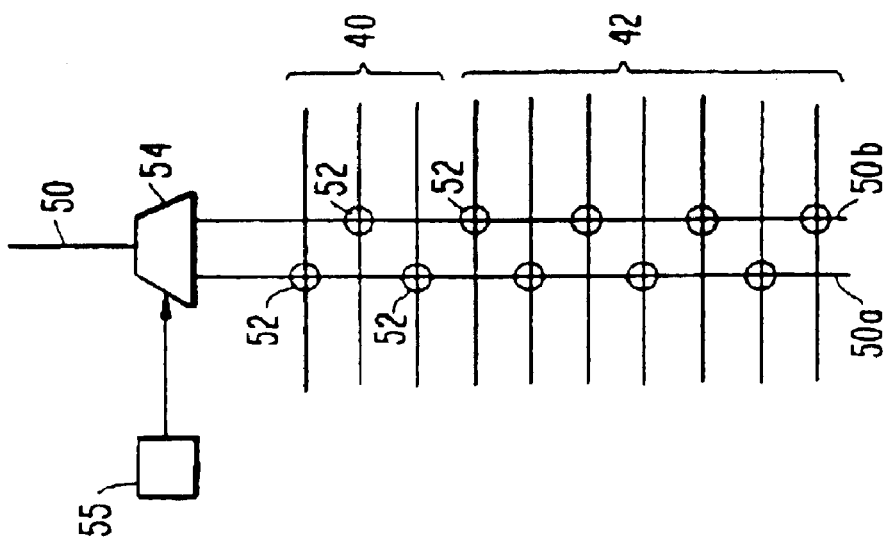
FIGS. 5–9 are schematic diagrams showing alternative ways of making certain interconnections in circuits of the type shown in other drawings.
Figure 5:
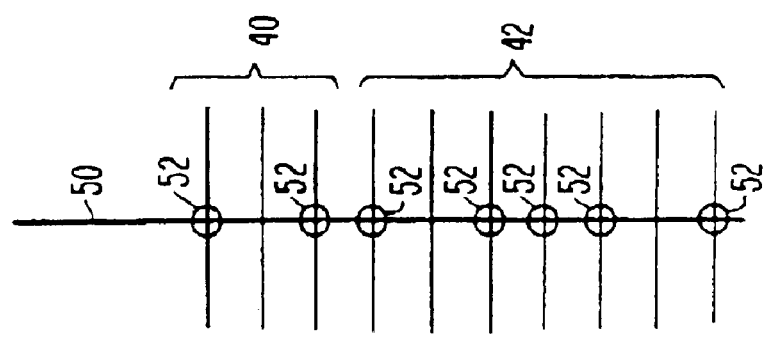
Figure 7:
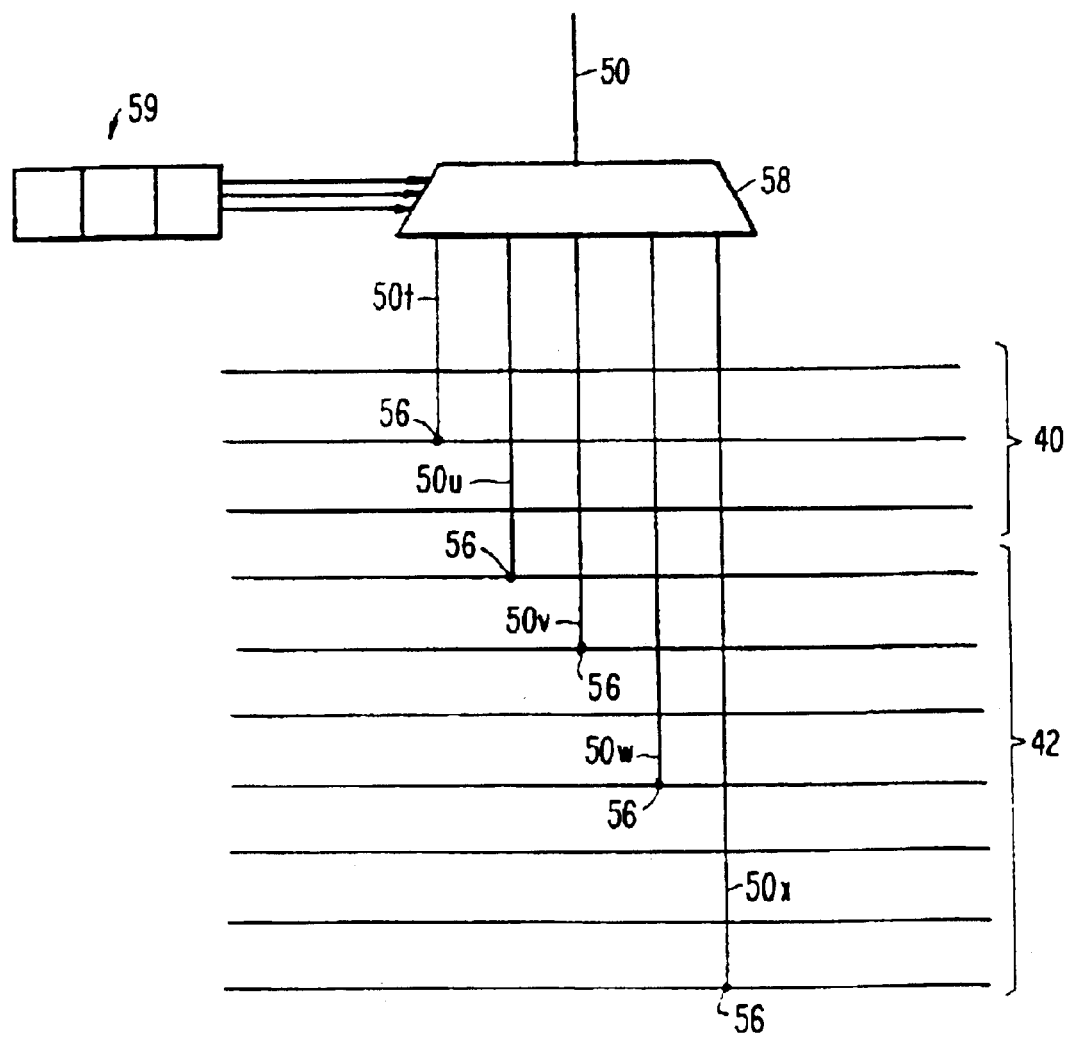

Conductors 50 can be configured in any of several ways. As shown in FIG. 5, for example, each conductor 50 can be a single line with programmable interconnections 52 to some or all of the horizontal conductors that it crosses. Alternatively as shown in FIG. 6, each conductor 50 can be the output signal of a multiplexer 54 which is fed by two (or more) conductors 50a and 50b. Each of conductors 50a and 50b has programmable interconnections 52 to a mutually exclusive subset of the input conductors crossed by 50a and 50b. These subsets are chosen so that no two adjacent input conductors 40 and 42 have programmable interconnections 52 to the same output conductors 50a and 50b. By thus spacing adjacent programmable interconnections parallel to the longitudinal axes of input conductors 40 and 42, it may be possible to place the input conductors closer together. This can be an important consideration given the large number of conductors on circuit 10. The capacitive loading on each of conductors 50a and 50b is less than it would be on a single conductor with the same total number of possible interconnections, thereby allowing faster operation of the device. Multiplexer 54 is controlled to connect one of its inputs 50a or 50b to its output 50 by programmable device 55. As another possible alternative shown in FIG. 7, each input conductor 40 and 42 which can be connected to output conductor 50 has a transverse branch conductor 50t through 50x connected to it by a fixed connection 56. These branch conductors are the inputs to a multiplexer 58 which can connect any one of its inputs to its output. Multiplexer 58 is controlled to make this connection by programmable elements 59. Fixed connections 56 can be made smaller than programmable interconnections, and they also reduce the load on input conductors 40 and 42 as compared to programmable interconnections such as 52 in FIGS. 5 and 6.

Figure 8:
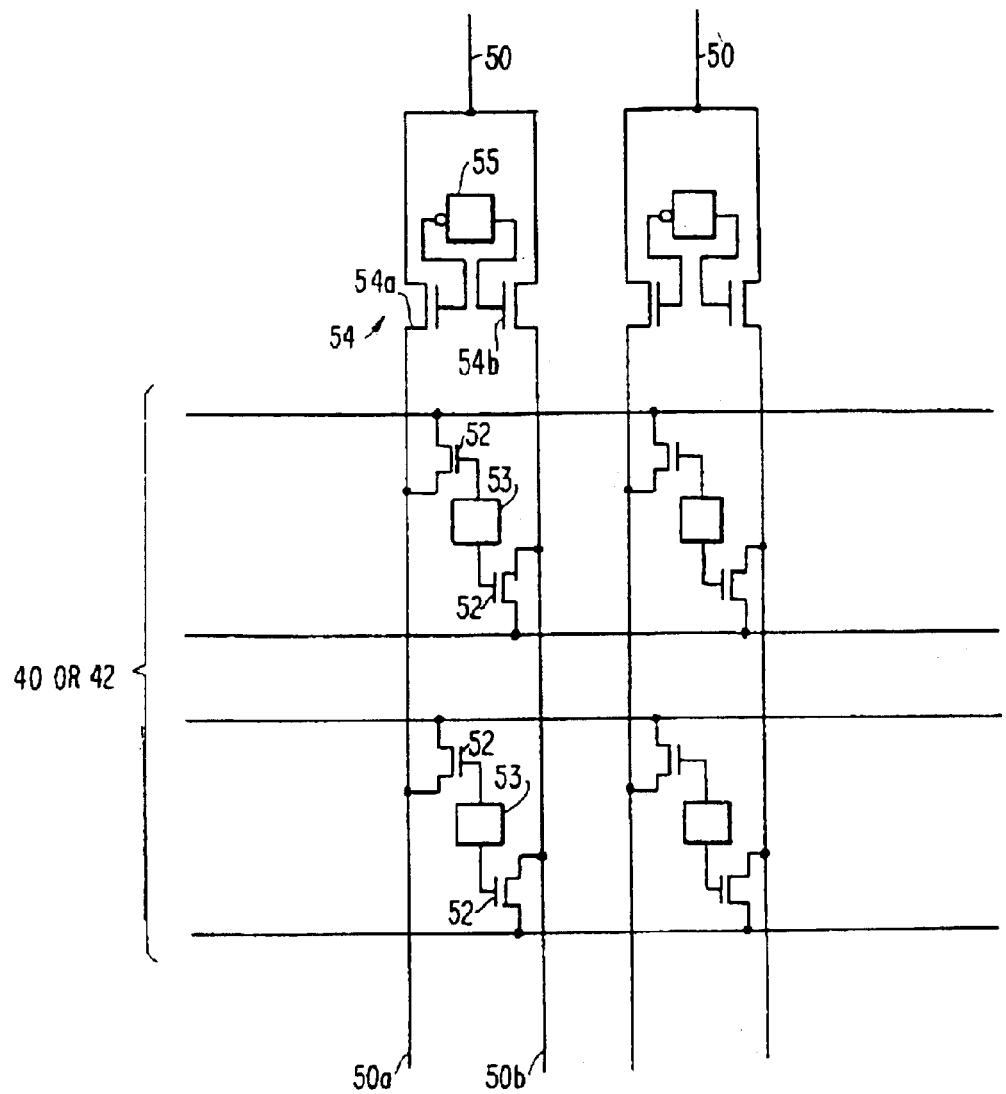

When the technique shown in FIG. 6 is used, the number of programmable elements required to control the interconnection elements can be dramatically reduced if desired by employing the enhancement shown in FIG. 8. In particular, one programmable element 53 (e.g., a conventional RAM cell) is used to control one interconnection element 52 associated with each of the two or more output conductors 50a and 50b feeding multiplexer 54. (In FIG. 8 multiplexer 54 is shown in more detail as including pass transistors 54a and 54b respectively controlled by the "true" and "complement" output signals of programmable element 55.) Thus when any programmable element 53 is programmed to make an input conductor to output conductor connection, two such connections are made. The final selection of the desired connection is made by multiplexer 54. As compared to embodiments in which each interconnection element is controlled by a separate programmable element, the required number of programmable elements is dramatically reduced (i.e., by nearly one-half) by employing the technique shown in FIG. 8. This can be especially important in the event that the programmable elements are relatively large (e.g., as compared to the interconnection elements) because significantly smaller interconnection arrays can be produced by reducing the number of programmable elements required in the array.

Although only two conductors 50a and 50b are shown feeding each multiplexer 54 in FIGS. 6 and 8, it will be understood that larger multiplexers fed by more than two conductors (e.g., four or eight conductors) can be used if desired in embodiments of the type shown in either of these FIGS. In the case of FIG. 8 type embodiments with more than two conductors feeding each multiplexer, each programmable element 53 can control one interconnection element 52 associated with each conductor feeding a multiplexer. This allows an even greater reduction in the required number of programmable elements.

Figure 9:
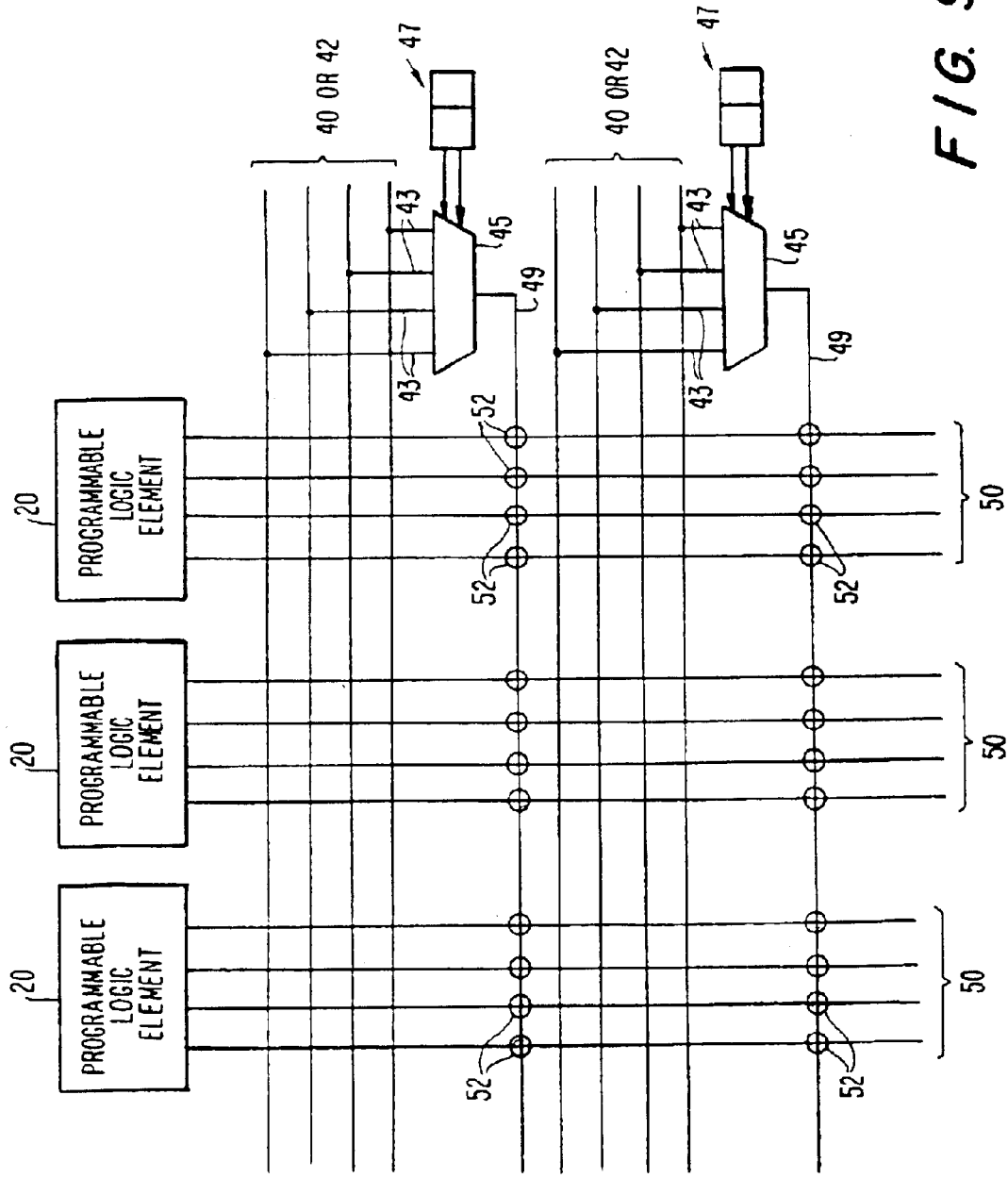

Another technique which can be used in accordance with this invention to provide interconnections between input conductors such as 40 and 42 and output conductors such as 50 is shown in FIG. 9. Instead of providing large numbers of programmable interconnections where input conductors 40 and 42 intersect output conductors 50, each input conductor has a transverse branch 43 fixedly connected to it. Several of these transverse branches are grouped as inputs to multiplexers 45. Each of multiplexers 45 is controlled by associated programmable elements 47 to select one of its inputs as its output 49. Each multiplexer output conductor 49 is extended (as an additional input conductor) across output conductors 50 and has programmable interconnections 52 to some or all of those output conductors. The technique shown in FIG. 9 reduces the size of the grid of intersecting conductors 40, 42, and 50 by reducing the number of programmable interconnections 52 that are employed. It also reduces the loading on input conductors 40 and 42.

Although the techniques described above in connection with FIGS. 6–9 are illustrated in the context of the signal conductors connected to logic elements 20, it will be understood that these techniques are equally applicable anywhere a cross point switch type interconnection is required between first and second groups of conductors on an integrated circuit.

Returning to the description of the vertical conductors in FIGS. 1–3, the other type of vertical conductors are identified by the reference number 60 in the FIGS. These are the only vertical conductors that extend between the horizontal rows of LABS 14. As can be seen in FIG. 2 there are two conductors 60 associated with each programmable logic element position across the circuit. In other words, the left-most pair of conductors shown in FIG. 2 extend along the entire vertical dimension of circuit 10 and have the same relationship to the left-most programmable logic element in each horizontal row that they are shown to have in the representative LAB shown in FIG. 2.

The manner in which the two conductors 60 associated with each vertical column of programmable logic elements 20 are utilized is more apparent in FIG. 3. Conductor 60a is connected only to one input of multiplexer 62 in the tri-state driver 24 of representative programmable logic element 20. (In at least some other elements 20 in this vertical column, conductor 60a is instead connected in the manner shown for conductor 60b in FIG. 3.) Conductor 60b is connected both to an input of multiplexer 62 and the output of tri-state driver element 64. (In at least some other elements 20 in this vertical column, conductor 60b is instead connected in the manner shown for conductor 60a in FIG. 3.) Note that the remaining input to multiplexer 62 and the input to element 64 is the output of logic module 22. The output of multiplexer 62 is applied to tri-state driver element 66. The output of tri-state driver element 66 is connected to one of long horizontal conductors 42. The connection made by multiplexer 62 and whether each of elements 64 and 66 is on or off are controlled by programmable elements 63, 65, and 67.

From the foregoing it will be apparent that conductors 60 can be used to convey signals from one horizontal row of LABs 14 to another horizontal row. For example, a programmable logic element output signal applied to conductor 60b via element 64 in FIG. 3 can be output from the multiplexer 62 in any other vertically aligned programmable logic element (or elements) and thereby put on the horizontal conductor 42 to which that multiplexer output is connected. From that horizontal conductor 42 the signal can be picked up by any conductor 50 to which that horizontal conductor is connectable. Note that elements 62 and 66 can alternatively be used to apply the output signal of the associated logic module 22 to the associated long horizontal conductor 42 so that in addition to being available as an input to other programmable logic elements in the associated LAB (via the associated short horizontal line 40), that logic module output can also be made available for input to programmable logic elements in other LABs in the associated horizontal row. Tri-state driver module 24 allows the logic module output signal which is being used in this way to be simultaneously applied to one of conductors 60 via element 64. On the other hand, any tri-state driver module 24 which is not being used to apply the output signal of the associated logic module 22 to a long horizontal conductor 42 is free for use in connecting a vertical conductor 60a or 60b to that long horizontal conductor.

Inputs and outputs (not shown) to integrated circuit 10 can be connected in any desired manner (e.g., by connecting selected conductors 42 or 60 to input and/or output pads via suitable input and/or output drivers).

Grouping programmable logic elements 20 into mutually exclusive LAB groups, each with associated short horizontal conductors 40 for transferring data among the programmable logic elements in that group, not only helps to improve the organization of the circuit (thereby simplifying programming), but also greatly reduces the number of long conductors (e.g., 42) that are needed. This in turn saves valuable space on the circuit chip.

Second Embodiment

Figure 10:
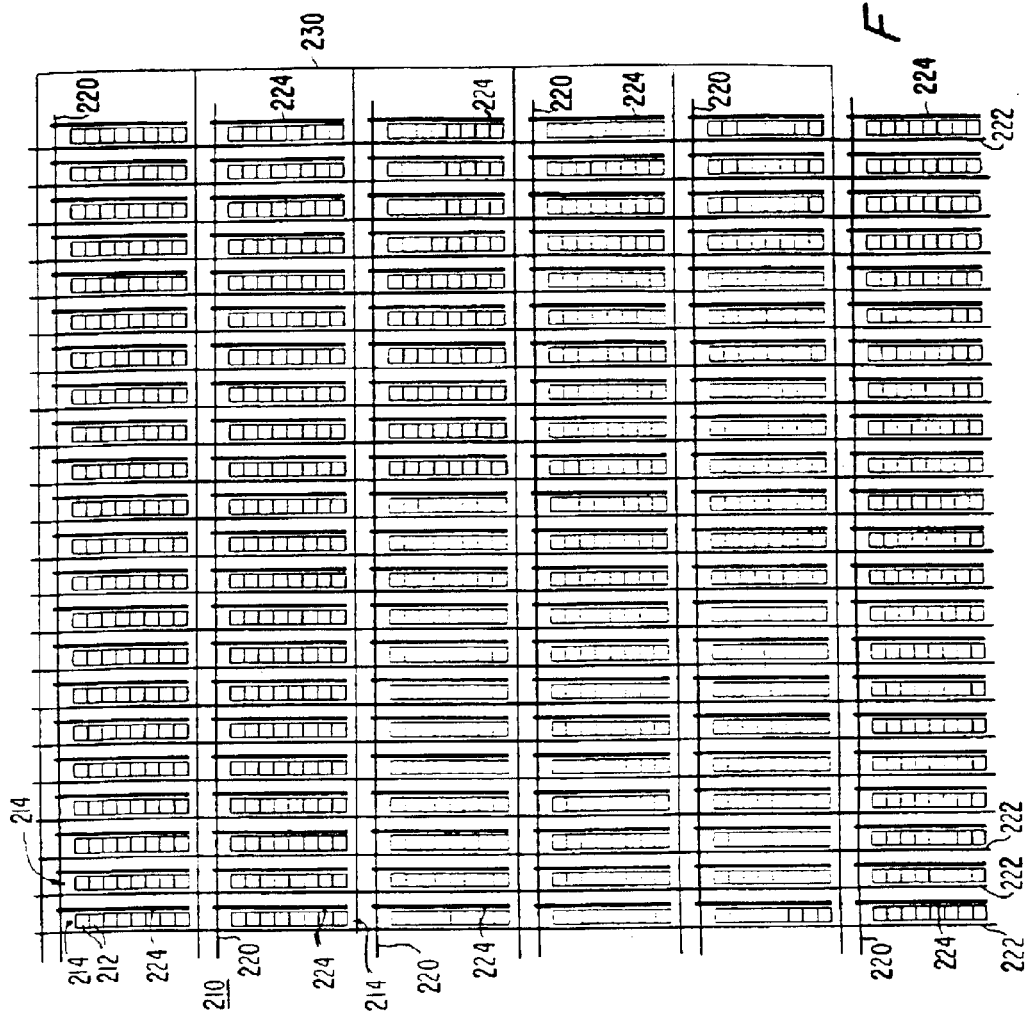
FIG. 10 is a simplified schematic block diagram of an illustrative programmable logic array integrated circuit constructed in accordance with the principles of the invention.

FIG. 10 shows the overall organization of an illustrative programmable logic array integrated circuit 210 constructed in accordance with the second embodiment of the present invention. Not all of the conductors employed in circuit 210 are shown in FIG. 10, but enough is shown in this FIG. to begin the discussion. Each logic module 212 is represented by a small square in FIG. 10. Logic modules 212 are grouped together in groups of eight. Each of these groups is referred to as a logic array block or LAB 214. LABs 214 are arranged in six horizontal rows and twenty two vertical columns on circuit 210. Accordingly, there are a total of one hundred thirty two LABs 214 and one thousand fifty six logic modules 212 on circuit 210. Each logic module 212 is capable of performing a relatively elementary logic function (discussed in more detail below), but extremely complex logic can be performed by variously interconnecting the logic modules as will now be discussed.

The interconnection circuitry shown in FIG. 10 includes (1) groups of so-called global horizontal conductors 220 interspersed between the horizontal rows of LABS, and (2) groups of global vertical conductors 222 interspersed between the vertical columns of LABS. These conductors are global in the sense that they extend along an entire row or column. Programmable interconnections can be made between intersecting horizontal and vertical conductors in order to apply signals on the vertical conductors to the horizontal conductors. Each LAB 214 has a group of vertical LAB input conductors 224 for conveying signals from the global horizontal conductors 220 intersected by conductors 224 to the logic modules 212 in that LAB.

In addition to the above-described conductors, FIG. 10 shows part of a network of so-called universal fast conductors. The conductors 230 of this network shown in FIG. 10 extend throughout the entire circuit and can be used as will be described in more detail below to convey widely used logic signals such as clock and/or clear signals to any logic modules 212 on the circuit.

Although other numbers of conductors can be used if desired, in the depicted preferred embodiment, there are one hundred seventy six conductors in each group of global horizontal conductors 220, there are sixteen conductors in each group of global vertical conductors 222, there are twenty four conductors in each group of LAB input conductors 224, and there are four universal fast conductors 230.

Figure 11:
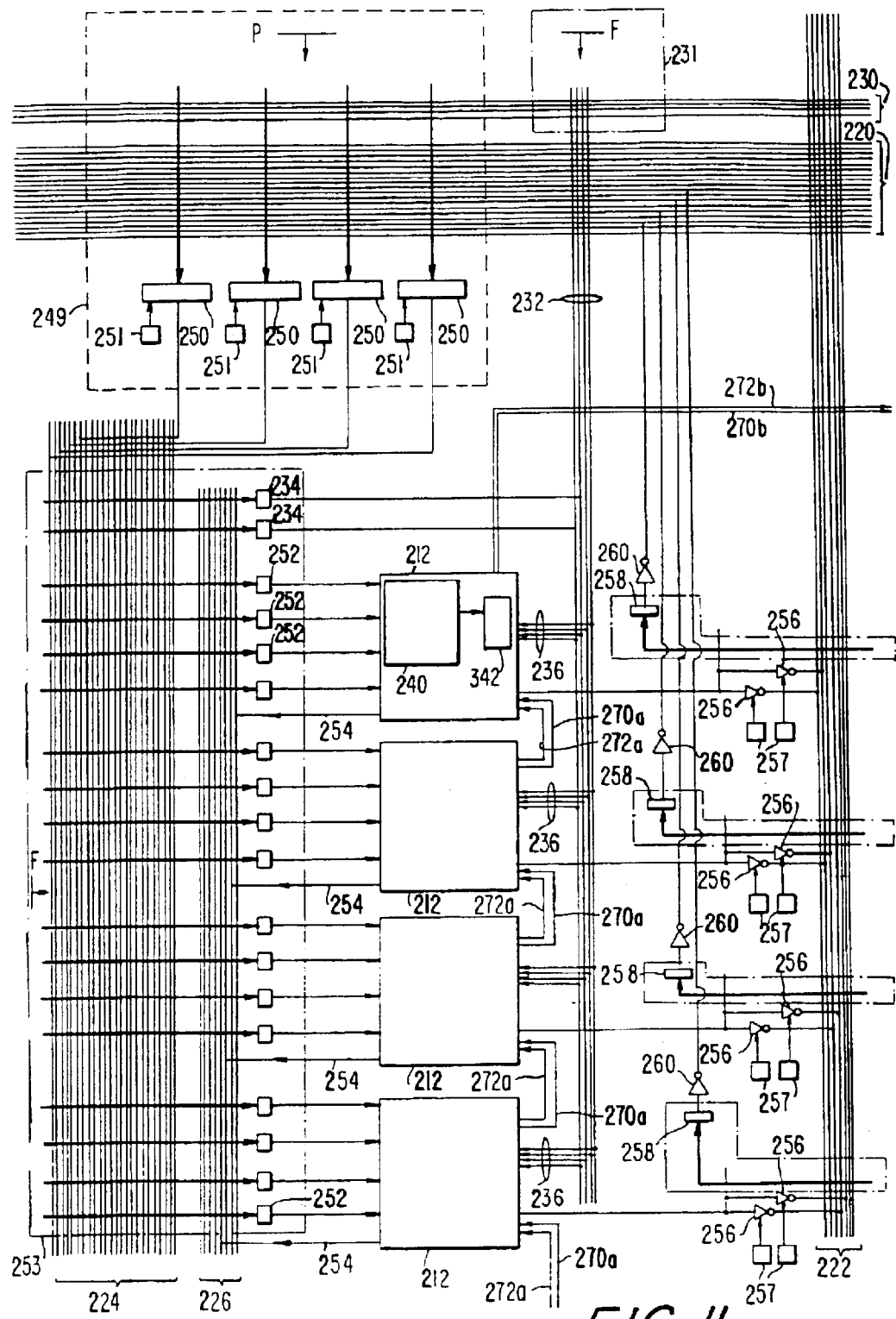
FIG. 11 is a more detailed schematic block diagram of an illustrative embodiment of a representative portion of the circuit shown in FIG. 10.

Turning now to FIG. 11 which shows one possible implementation of part of a typical LAB 214 on circuit 210, four representative logic modules 212 are shown. Although logic modules 212 can be implemented in other ways (e.g., as product-term-based macrocells (an alternative which is discussed in more detail below, for example, in connection with FIGS. 16a–c)) in the illustrative embodiment shown in FIG. 11 each logic module 212 includes a look up table or universal logic block ("ULB") 240 and a flip-flop type device 342. Each look up table 240 is basically a circuit which can be programmed to produce an output signal which is any logical function of four input signals applied to the look up table. Each flip-flop 342 is a circuit which can be programmed either to store or to simply pass through the output signal of the associated look up table (see, for example, the circuit shown in Norman et al. U.S. Pat. No. 4,864,161). Alternatively, device 342 could be a flip-flop with no pass through or bypass capability.

In addition to the above-described representative logic modules, FIG. 11 shows portions of representative global horizontal conductors 220, global vertical conductors 222, LAB input conductors 224, and universal fast conductors 230. Each of LAB input conductors 224 can be connected to a selected one (or more) of conductors 220 and 230 via a programmably controlled programmable logic connector ("PLC") 250 (only some of which are shown in FIG. 11). PLCs 250 can be implemented in any of a wide variety of ways. For example, each PLC 250 can be a relatively simple programmable connector such as a plurality of switches for connecting any one of several inputs to an output. Alternatively, each PLC can be a somewhat more complex element which is capable of performing logic (e.g., by logically combining several of its inputs) as well as making a connection. In the latter case, for example, each PLC can be product term logic implementing functions such as AND, NAND, OR, or NOR. Examples of components suitable for implementing PLCs 250 are EPROMs, EEPROMs, pass transistors, transmission gates, antifuses, laser fuses, metal optional links, etc. The components of PLCs 250 can be controlled by various function control elements ("FCEs") as described in more detail below (although with certain PLC implementations (e.g., fuses and metal optional links) separate FCE devices are not required, so that in those cases the depiction of FCE devices in the accompanying drawings merely indicates that the PLCs are programmable).

In the depicted, presently preferred embodiment each PLC 250 a 15-to-1 switch which is controlled by programmable function control elements ("FCEs") 251 on circuit 210 to connect one of its fifteen inputs to its output. Each of the fifteen inputs is the signal on a predetermined respective one of conductors 220 or 230. There is one PLC 250 for each of the twenty four LAB input conductors 224. Each of conductors 220 and 230 is connected to two of PLCs 250. Accordingly, each of conductors 220 and 230 is connectable to two of conductors 224. The letter P and the associated arrow symbol inside dotted line 249 indicate that the population of connections from conductors 220 and 230 to the inputs of each of PLCs 250 is a partial population.

FCEs 251 can also be implemented in any of several different ways. For example, FCEs 251 can be SRAMs, DRAMs, first-in first-out ("FIFO") memories, EPROMs, EEPROMS, function control registers (e.g., as in Wahlstrom U.S. Pat. No. 3,473,160), ferro-electric memories, fuses, antifuses, or the like.

Each of the four data inputs to each logic module 212 can be connected to any one (or more) of LAB input conductors 224 (and/or) any one (or more) of local conductors 226 via a PLC 252. PLCs 252 (and each similar PLC 234 which are discussed below) may have any of the characteristics described above for the general case of PLCs 250. However, in the depicted, presently preferred embodiment each of PLCs 252 (and each similar PLC 234) is a 32-to-1 switch so that any one of the 224 LAB input conductors 224 or any one of the eight local conductors 226 can be connected to each LAB data input. Accordingly, the letter F and the associated arrow symbol inside chain dotted line 253 indicate that the population of connections from conductors 224 and 226 to PLCs 234 and 252 is a full population. To avoid overcrowding the drawing, the FCEs (similar to above-described FCEs 251) for programmably controlling PLCs 234 and 252 are not shown separately, but rather are assumed to be part of elements 234 and 252.

Figure 18:
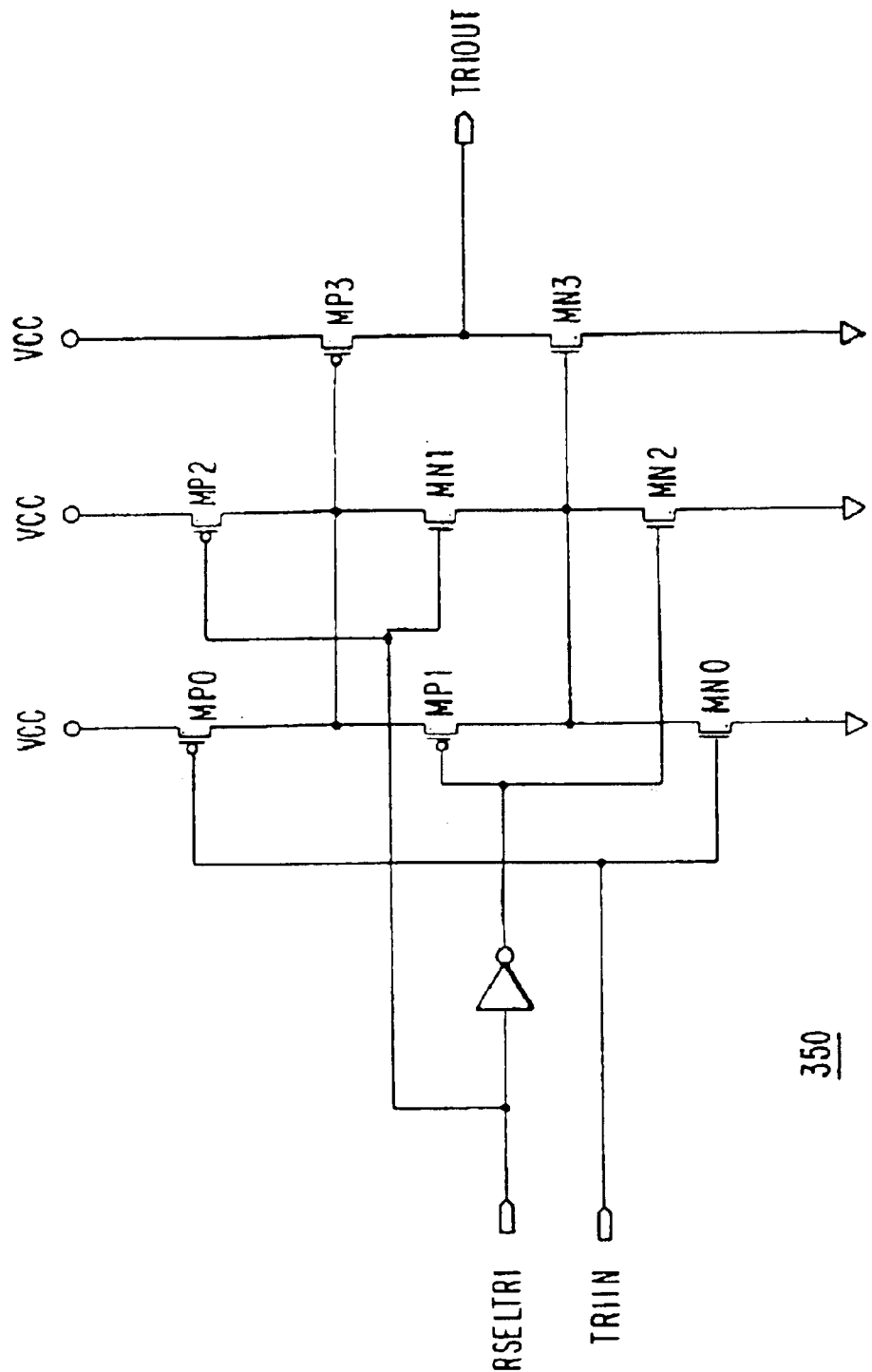
FIG. 18 is a schematic diagram of an illustrative embodiment of a representative element shown in FIG. 11.

The data output of the flip-flop 342 in each logic module 212 can be applied (via conductor 254) to a respective one of local conductors 226. These conductors serve only the logic modules in the associated LAB 214. In other words, conductors 226 do not extend beyond the associated LAB. The data output of the flip-flop 342 in each logic module 212 can also be applied to either or both of two global vertical conductors 222 (via tri-state drivers 256), and to one of global horizontal conductors 220 (via PLC 258 and tri-state driver 260). The other input or inputs to each PLC 258 are the signals from one or more of global vertical conductors 222. Accordingly, global vertical conductors 222 are selectively connectable to global horizontal conductors 220 via PLCs 258 and tri-state drivers 260. PLCs 258 may be similar to any of the above-described PLCs. The use of tri-state drivers 256 and 260 is advantageous to strengthen signals which may be required to travel relatively long distances throughout circuit 210 and/or which may be inputs to relatively large numbers of other components. A suitable tri-state driver is shown in FIG. 18 and described in detail below. Some or all of tri-state drivers 256 and 260 may be controlled (i.e., turned on or off) by FCEs (e.g., FCEs 257) on circuit 210. PLCs 258 are also typically controlled by FCES on the circuit. All of these FCEs may be similar to above-described FCEs 251.

In addition to being available as data inputs to logic modules 212, the signals on any of conductors 224 and 226 can also or alternatively be applied to any of local vertical conductors 232 via PLCs 234. In the depicted, presently preferred embodiment, each of PLCs 234 is a 32-to-1 switch, but PLCs 234 can alternatively have any of the characteristics described above for the general case of PLCs 250. Although only two PLCs 234 are shown in FIG. 11, there is preferably one such PLC for each of the four conductors 232. Each of conductors 232 is connectable to any one of universal fast conductors 230 for receiving the signal on the fast conductor. These connections from conductors 230 to conductors 232 are preferably made in the same way that the connections from conductors 224 and 226 to conductors 232 are made, i.e., by PLCs controlled by FCEs (all represented by element 231 in FIG. 11). Again, although each of these PLCs can have any of the characteristics described above for the general case of PLCs 250, in the depicted, presently preferred embodiment each of these PLCs can connect any of conductors 230 to an associated one of conductors 232. The letter F and the arrow symbol inside chain dotted line 231 indicate that the population of possible connections from conductors 30 to each of conductors 232 is a full population. Each of conductors 232 is connectable (via conductors 236) to each of logic modules 212. FCE-controlled PLCs in each logic module allow these signals to be used for such purposes as flip-flop clock and flip-flop clear (see FIG. 17 (discussed below) which shows an illustrative logic module 12 in more detail). Thus local vertical conductors 232 are known as clock and clear lines and can be driven from fast lines 230 for synchronous clocks and clears (i.e., clocks and clears which come from outside of device 210 and are available everywhere throughout device 210), or from LAB input lines 224 or local lines 226.

There are two other types of logic module interconnections shown in FIG. 11 which require discussion. The first of these is carry chain interconnection represented in part by conductors 270a and 270b. These interconnections allow a carry out output of each logic module 212 to be used as a carry in input to an adjacent or nearby logic module as shown, for example, in Cliff et al. U.S. Pat. No. 5,274,581 (see also FIG. 17 herein). For example, carry chain conductors 270a allow the carry out output of each logic module 212 shown in FIG. 11 to be the carry in input to the next higher logic module in that FIG. Similarly, carry chain conductor 270b runs from the top-most logic module 212 in the LAB fragment shown in FIG. 11 to the bottom-most logic module in the horizontally adjacent LAB in the adjacent column of LABS. This allows the carry chain to continue from LAB to LAB if desired.

The other type of logic module interconnection remaining to be discussed is illustrated by representative conductors 272a and 272b in FIG. 11 (see also Cliff et al. U.S. Pat. No. 5,258,668). These conductors are called cascade connect conductors. They allow the data outputs of adjacent or nearby logic modules 212 to be logically combined, if desired, to perform more complex logic functions without the need to pass intermediate data through the general interconnection network. The manner in which cascade connect conductors 272 are employed in the logic modules is shown in detail in FIG. 12.

Figure 12:
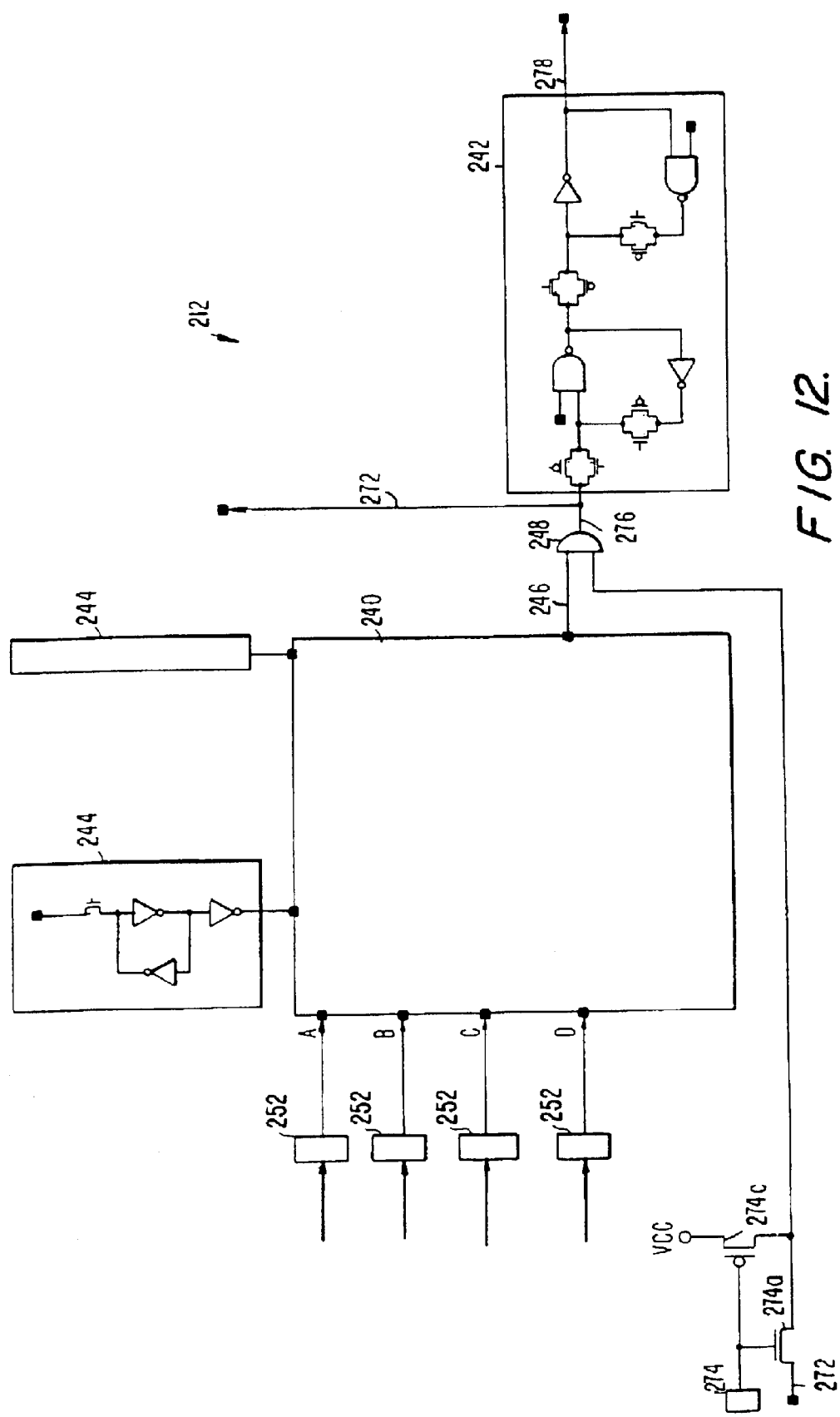
FIG. 12 is a still more detailed schematic block diagram of an illustrative embodiment of a representative portion of the circuitry shown in FIG. 11.

As shown in FIG. 12, a typical logic module 212 includes look up table or ULB 240 which is controlled by 216 FCEs 244 to produce on data output lead 246 any desired logical function of the four data input signals from PLCs 252. (Although in the particular embodiment shown in FIG. 12 a representative FCE 244 is depicted as a RAM cell, it will be understood that FCEs 244 can be implemented in any of a wide variety of ways as discussed above in connection with FCEs 251). The signal on lead 246 is applied to one input of AND gate 248. (Although shown as an AND gate in FIG. 12, cascade connect device 248 could alternatively be any other suitable two-input logic function such as an EXCLUSIVE OR gate.) The other input to AND gate 248 is the cascade connect input from another logic module 212 gated by transistor 274a which is controlled by FCE 274b (similar to previously described FCES). (If transistor 274a is disabled by FCE 274b, then transistor 274c is enabled to connect the second input of AND gate 248 to a source of logical 1 potential.) Accordingly, assuming that transistor 274a is enabled, AND gate 248 produces an output signal on lead 276 which is the logical AND of the signals on incoming leads 246 and 272. The signal on lead 276 can therefore be a significantly more complex logic function than could be produced by one look up table 240 by itself. In addition to being applied to flip-flop 242 and then by way of lead 278 and elements 254, 256, 258, and 260 to the more general interconnection structure, the signal on lead 276 is also applied to another cascade connect conductor 272 for cascade connection to another adjacent or nearby logic module 212 in the same way that the incoming lead 272 shown in FIG. 12 is connected to the logic module shown in that FIG.

FIG. 11 shows that each cascade connect conductor 272a from a logic module 212 is connected to the next higher logic module in that FIG. The cascade connect output from the top-most logic module 212 in FIG. 11 goes (via cascade connect conductor 272b) to logic modules in an adjacent column of LABS (e.g., to the bottom-most logic modules in the LAB immediately to the right of the LAB fragment shown in FIG. 11).

Figure 13:
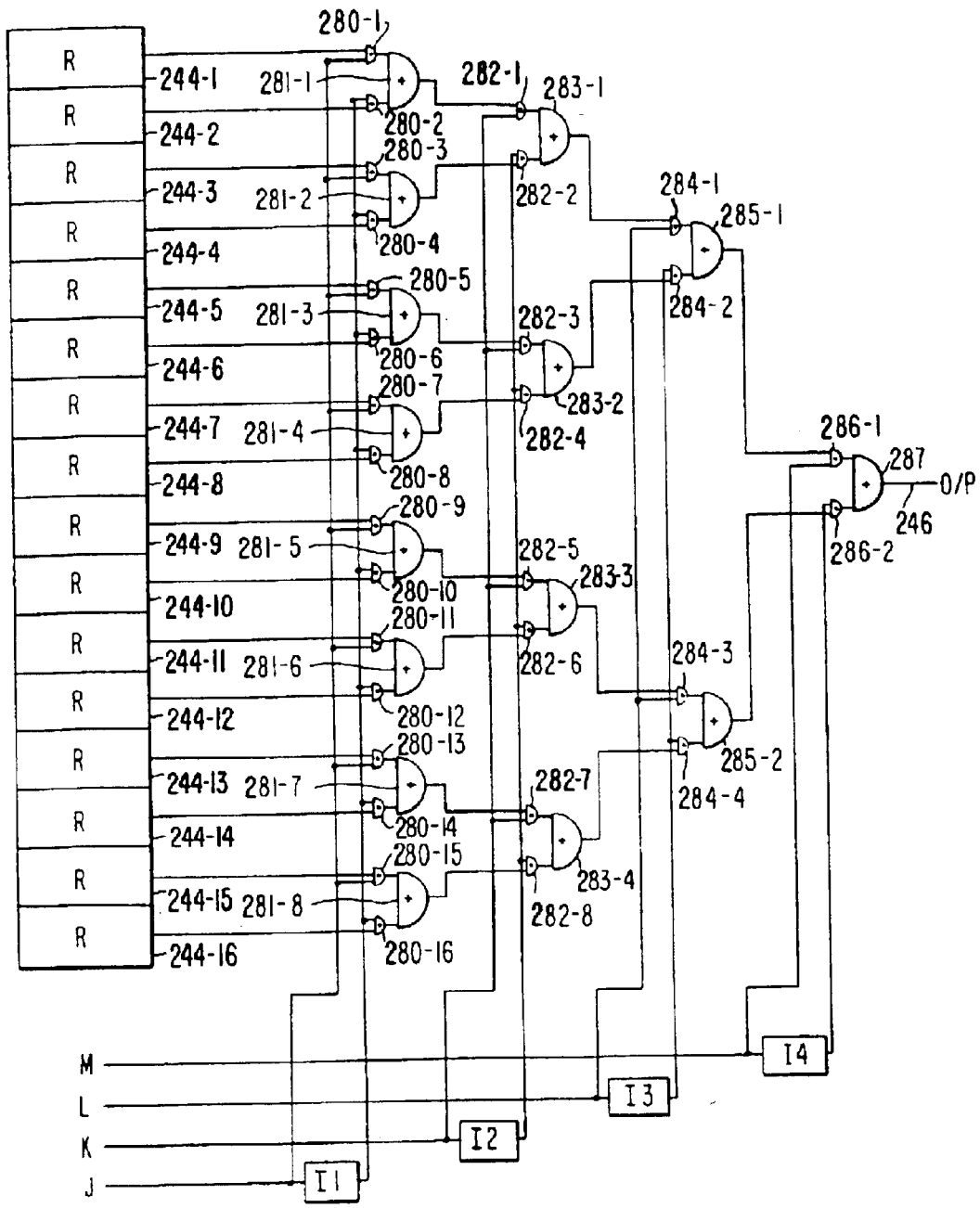
FIG. 13 is a schematic block diagram of an illustrative embodiment of a portion of the circuitry shown in FIG. 12.

FIG. 13 shows a typical basic look up table 240 in more detail. (Look up table 240 may be modified as shown in above-mentioned U.S. Pat. No. 5,274,581 to facilitate performance of fast carry logic, but FIG. 13 shows the basic structure of a four-input look up table.) This table is controlled by sixteen FCEs 244. The output signal of each of these FCEs is applied to a respective one of sixteen AND gates 280. Alternate ones of AND gates 280 are respectively controlled by the true and complement of the first data input J, the complement of input J being produced by inverter I1. The outputs of adjacent pairs of switches 280 are then combined by OR gates 281 and applied to eight AND gates 282. Alternate ones of AND gates 282 are respectively controlled by the true and complement of the second data input K, the complement of input K being produced by inverter I2. The outputs of adjacent pairs of AND gates 282 are combined by OR gates 283 and then applied to four AND gates 284. Alternate ones of AND gates 284 are respectively controlled by the true and complement of the third data input L, the complement of input L being produced by inverter I3. The outputs of adjacent pairs of AND gates 284 are combined by OR gates 285 and applied to two AND gates 286. One of AND gates 286 is controlled by the true of the fourth data input M, while the other AND gate 286 is controlled by the complement of that input (produced by inverter I4). The outputs of AND gates 286 are combined by OR gate 287 to produce the data output on conductor 246. It will be apparent from the foregoing that any desired logical function of data inputs J–M can be produced by appropriately programming FCEs 244.

Figure 14:
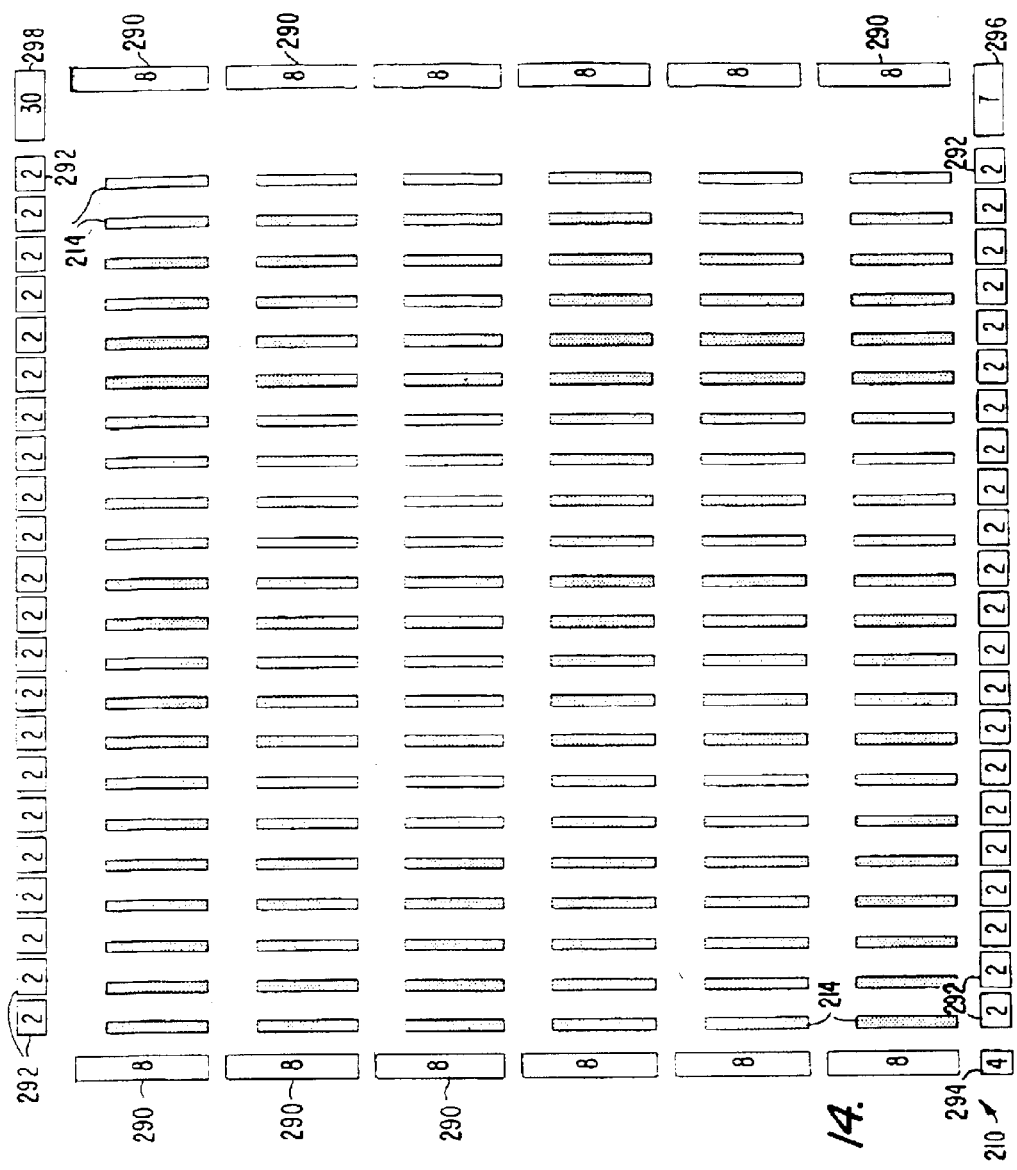
FIG. 14 is another view of the circuit of FIG. 10 showing an illustrative embodiment of additional elements of that circuit.

FIG. 14 shows how input/output pins may be provided on circuit 10. Six groups 290 of eight input/output pins are shown along each side of circuit 210. Twenty-two groups 292 of two input/output pins are shown along each of the top and bottom of the circuit. In addition, there are four fast input pins 294 respectively connected to fast conductors 230, seven control pins 296 for use during programming of device 210, and approximately thirty supply pins 298 for supplying power and ground potential to device 210.

Figure 15A:
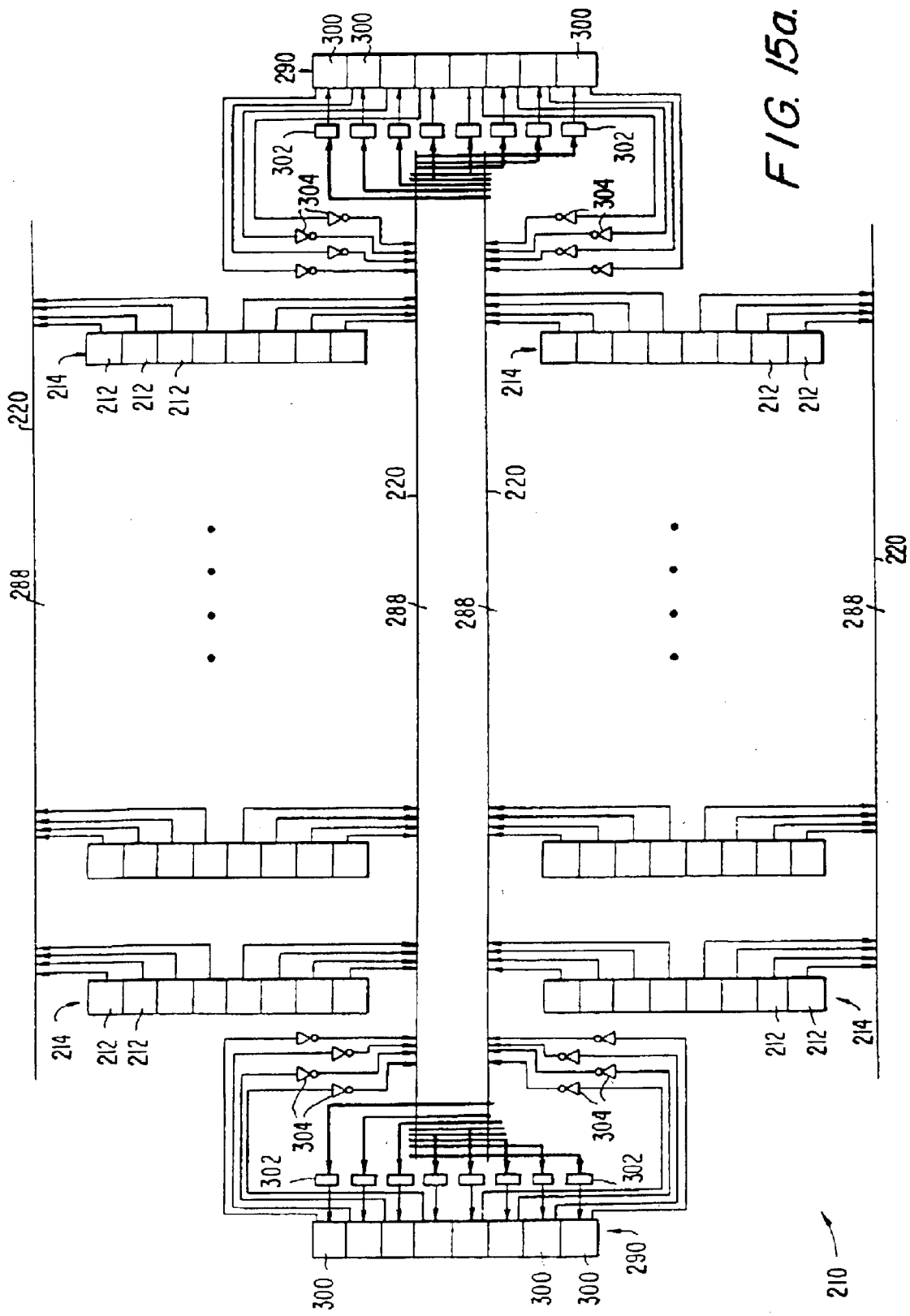
FIGS. 15a and 15b are schematic block diagrams showing an illustrative embodiment of representative portions of FIG. 14 in more detail.

Although other arrangements for connecting the conductors on device 210 to its input/output pins are possible, FIGS. 6a and 6b show parts of an illustrative embodiment of such an arrangement. In FIG. 15a the one hundred seventy six global horizontal conductors 220 associated with each horizontal row of LABs 214 are arranged so that half can receive the outputs of the drivers 260 (FIG. 11) associated with the top four logic modules 212 in each LAB in that row, while the other half of these conductors 220 can receive the outputs of the drivers 260 associated with the lower four logic modules 212 in each LAB in that row. Accordingly, in FIG. 15a each group of one hundred seventy six global horizontal conductors 220 is shown divided into two subgroups of 288 such conductors, one subgroup being above the associated row of LABS 214, and the other subgroup being below that row of LABS. Each input/output pin 300 in each group 290 of such pins can receive an output via a PLC 302 from the conductors 220 in two subgroups of 288 such conductors. (Again, PLCs 302 can have any of the characteristics described above for the general case of PLCs 250, and PLCs 302 are controlled by programmable FCEs similar to those described above.) One of these two subgroups of conductors is associated with the lower logic modules 212 in one row of LABs 214, while the other subgroup of conductors is associated with the upper logic modules 212 in the LAB row immediately below the first row.

For use as an input pin, each pin 300 is connected through two tri-state drivers to two of conductors 220. Thus each symbol 304 in FIG. 15a represents two tri-state drivers, each of which is programmably controlled (e.g., by an FCE similar to those described above).

Figure 15B:
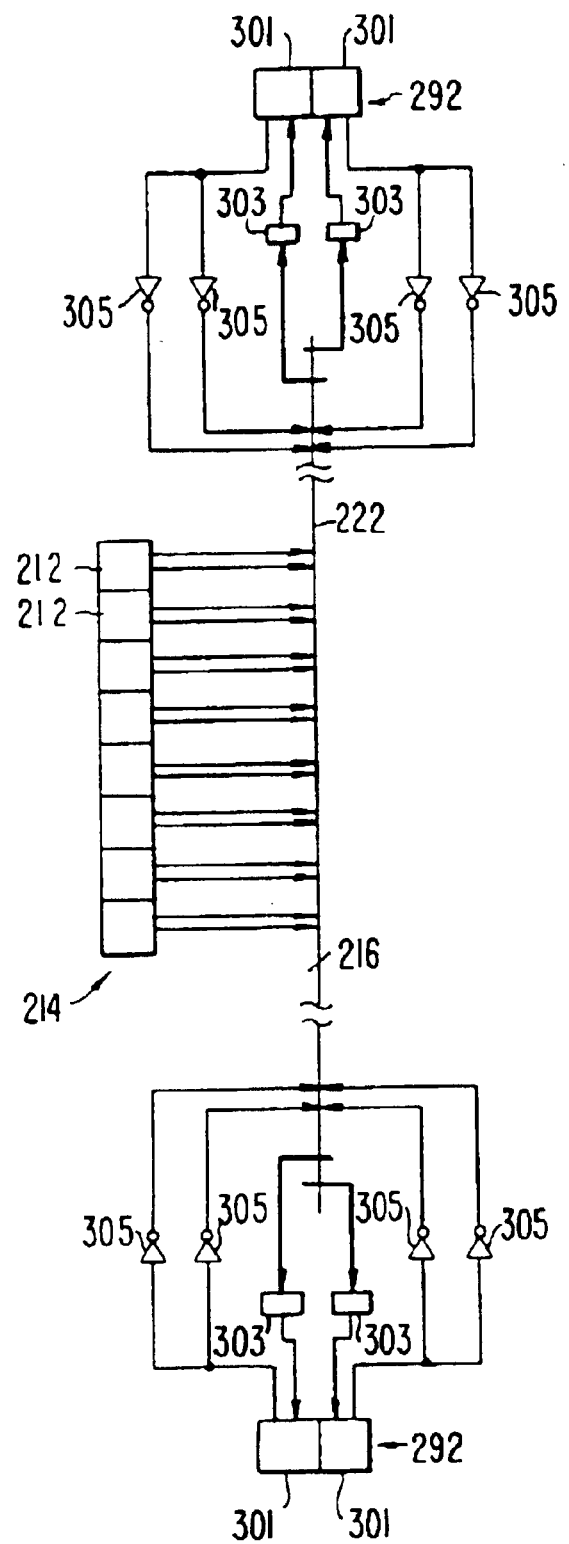

In FIG. 15b the 16 global vertical conductors 222 associated with each vertical row of LABS 214 are split into two groups of eight conductors at the top and bottom of the device. Each group of eight conductors is applied to a respective one of PLCs 303 (similar to the above-described PLCS). Each PLC 303 applies one (or more) of the signals applied to it to an associated input/output pin 301. For use as an input pin, each pin 301 is connected through two programmable tri-state drivers 305 to two of conductors 222.

Figure 16A:
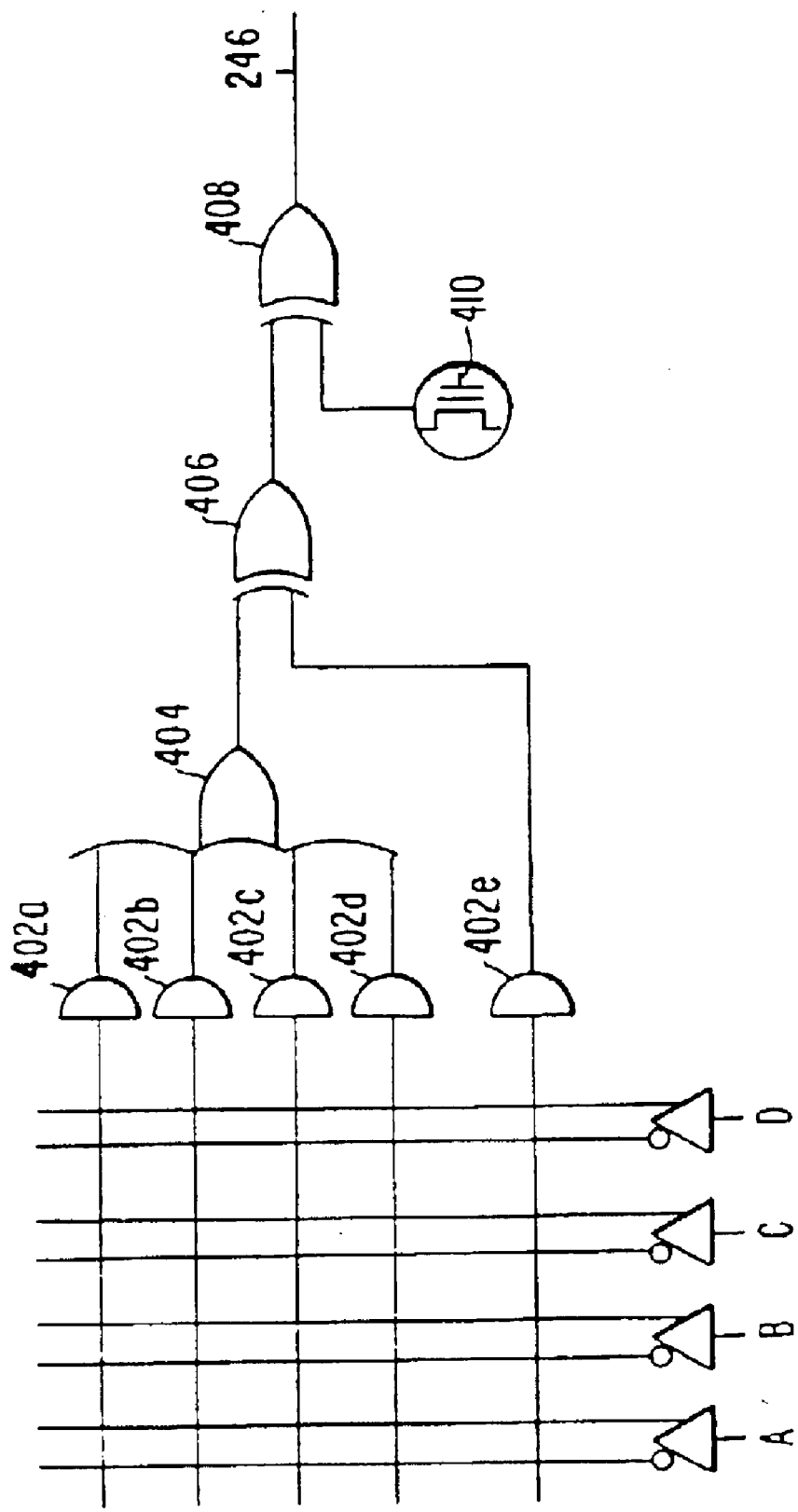
FIGS. 16a through 16c are schematic diagrams showing illustrative alternative embodiments of portions of the circuitry shown in FIG. 12.

As mentioned above, logic modules 212 can be implemented in other ways. For example, the portion of each logic module 212 which is described above as a look up table 240 can alternatively be implemented as sum-of-products logic of the type shown in FIG. 16a. The particular logic shown in FIG. 16a is of the well known "programmable AND, fixed OR" type. In this logic the true or complement of any of inputs A–D (which correspond to signals A–D in FIG. 12) is programmably connectable to each of AND gates 402a–e. Accordingly, each of these AND gates produces the logical "product" of the inputs connected to it. These products are sometimes referred to as "product terms" or "pterms". The outputs of AND gates 402a–d are all applied to OR gate 404. The output signal of OR gate 404 is therefore the logical "sum" of the applied pterms. The output of OR gate 404 is applied to EXCLUSIVE OR gate 406. The other input to gate 406 is pterm 402e. Accordingly, pterm 402e can be used (in conjunction with gate 406) to selectively invert or otherwise gate the sum-of-products output of OR gate 404. The output of gate 406 is applied to EXCLUSIVE OR gate 408. The other input to gate 408 is the output signal of programmable FCE 410 (similar to the other FCEs described above). Accordingly, FCE 410 can be used (in conjunction with gate 408) to selectively invert the output of gate 406. The output of gate 408 can be applied, inter alia, to the data input of the register 242 of the logic module.

Another example of a possible alternative construction of logic modules 212 is shown in Pedersen U.S. Pat. No. 5,121,006, which is hereby incorporated by reference. The macrocell structure 100 shown and described in that patent can be readily employed as the logic module 212 in the programmable logic array structures of this invention.

Figure 16C:
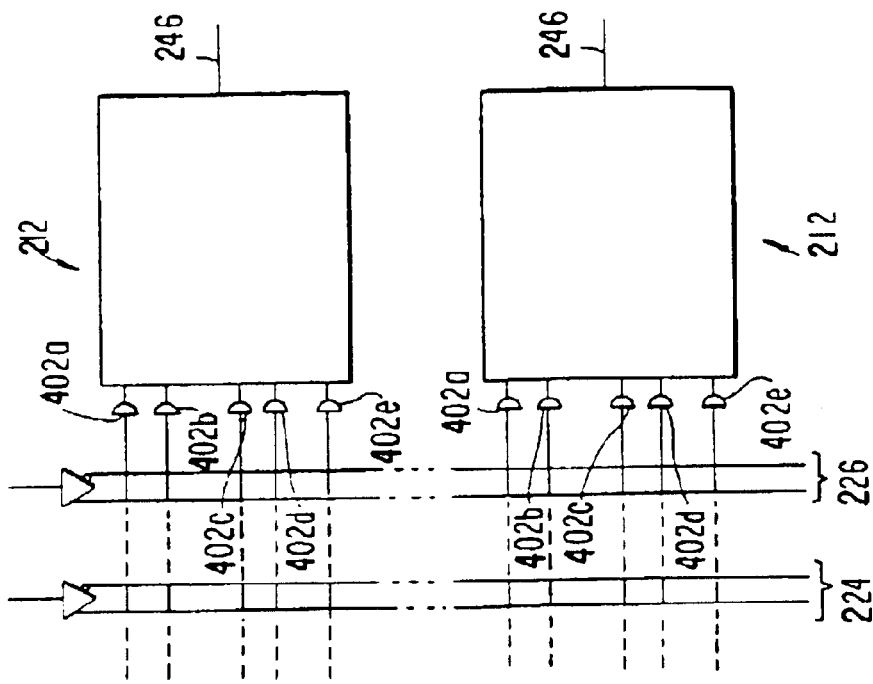
Figure 16B:
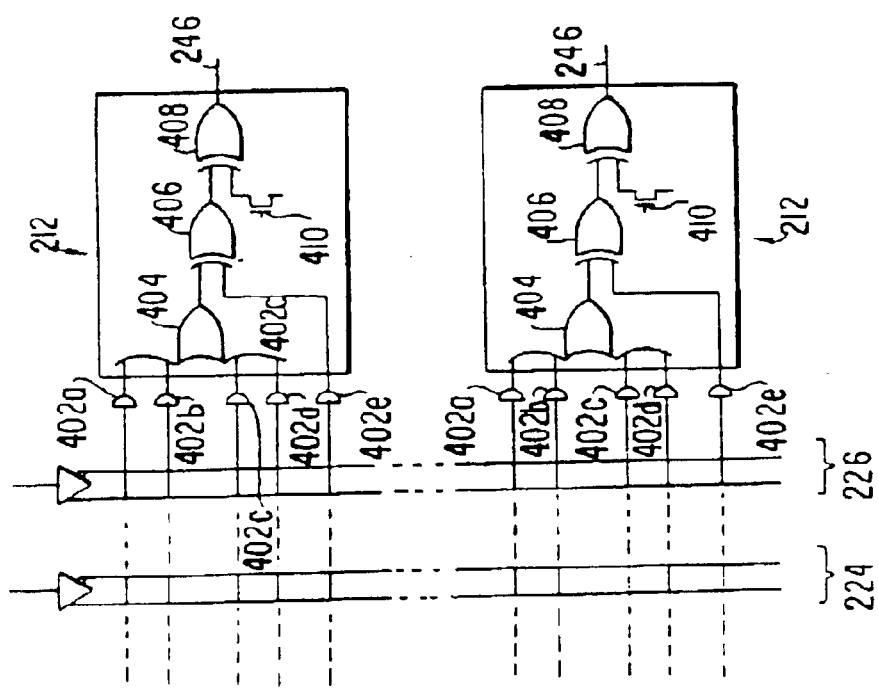

Still other examples of possible logic module construction are shown in FIGS. 16b and 16c. In FIG. 16b each conductor 224 and 226 (corresponding to conductors 224 and 226 in FIG. 11) is present in both the true and complement form. Pterms are formed in programmable connections between these conductors and the inputs to AND gates 402a–e. The remainder of each FIG. 16b logic module may then be similar to the corresponding portion of the circuitry shown in FIG. 16a.

In the further alternative shown in FIG. 16c, the circuitry outside the rectangular boxes may be identical to the corresponding portion of FIG. 16b. The circuitry represented by each rectangular box in FIG. 16c may be the macrocell structure 100 shown in above-mentioned U.S. Pat. No. 5,121,006.

Figure 17:
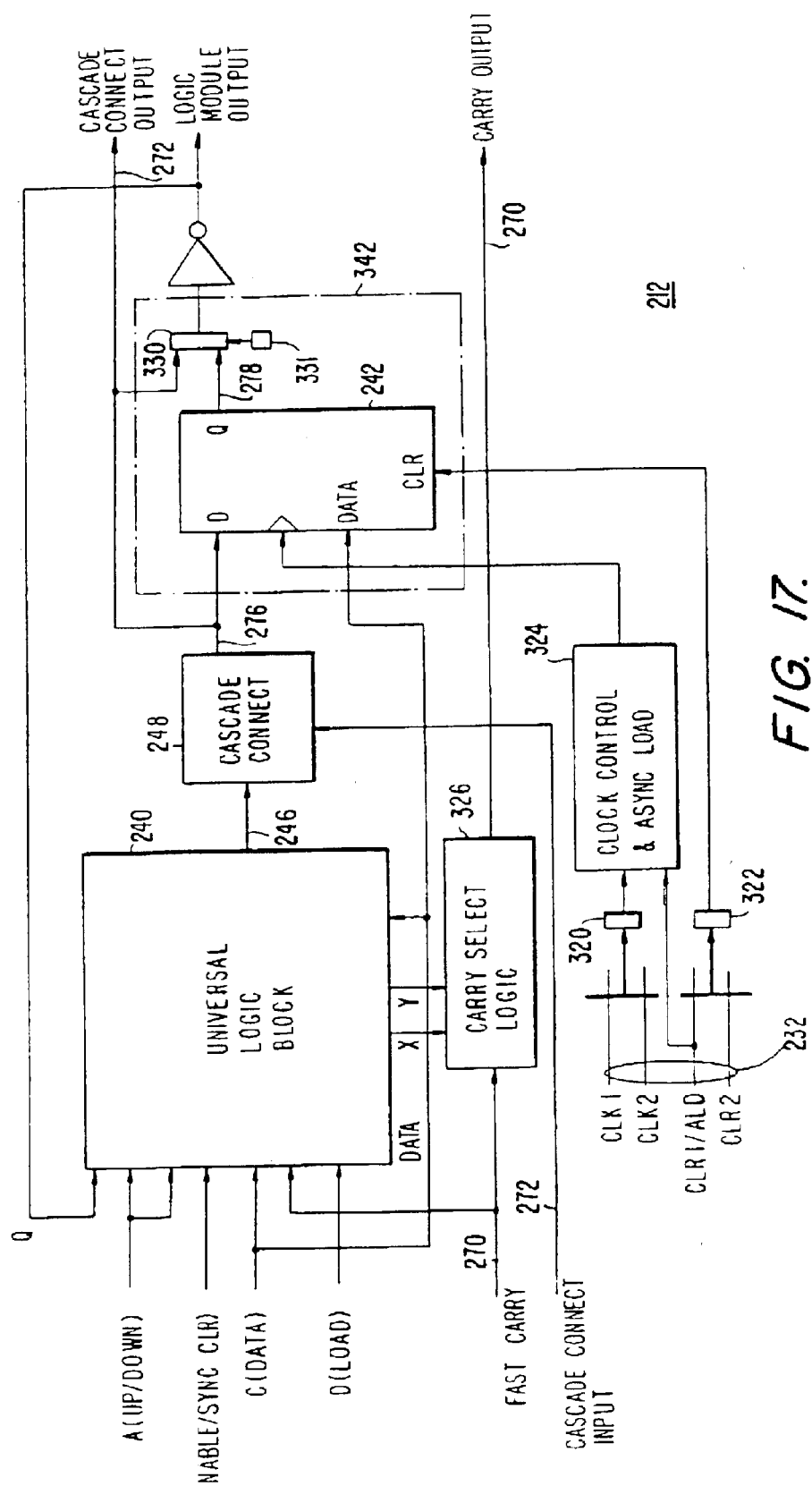
FIG. 17 is another more detailed schematic block diagram of an illustrative embodiment of a representative portion of FIG. 11.

FIG. 17 is another depiction of an illustrative logic module 212 in accordance with this invention. Certain features shown in FIG. 17—especially those related to the implementation of fast carry logic and the use of logic modules of this type in adders and counters—are shown in even more detail in above-mentioned U.S. Pat. No. 5,274, 581. For example, that patent explains that input C is applied to flip-flop 242 as data (in addition to being applied to universal logic block 240) to facilitate loading data into the flip-flop when logic module 212 is to be used as one stage of a loadable counter. Cascade connect input 272 is applied as one input to logic element 248 (typically an AND gate as described above in connection with FIG. 12). The desired signals on clock and clear lines 232 are selected by programmable (i.e., FCE-controlled) PLCs 320 and 322. The output of PLC 322 is applied to the clear input terminal of flip-flop 242. The output of PLC 320 and one of signals 232 are applied to clock control and asynchronous load control logic 324 to produce a signal applied to the clock input terminal of flip-flop 242. This signal controls the clocking of flip-flop 242, as well as the asynchronous loading of that flip-flop (e.g., when loading the starting value into a loadable counter).

The main data output 246 of universal logic block 240 is the other input to logic element 248. The output of element 248 is the D input to flip-flop 242 (for registered output from logic module 212). The output of element 248 can also bypass flip-flop 242 via programmable (i.e., FCE-controlled) switch 330 (for unregistered output from the logic module). FCE 331 controls switch 330. Finally, the output of element 248 is also the cascade connect output 272 from this logic module to the next logic module 212 in the cascade connect chain.

Universal logic block 240 in FIG. 17 is equipped as shown in above-mentioned U.S. Pat. No. 5,274,581 to provide as outputs X and Y the logical NOR and logical NAND of two inputs to block 240. As is also shown in said above-mentioned patent, carry select logic 326 inverts X and Y, and then uses fast carry input 270 to select the appropriate one of the inverted signals as the fast carry output 270 to be applied to the next logic module 212 in the fast carry chain.

As mentioned above, FIG. 18 shows a typical tri-state driver 350 such as can be used for drivers 256 and 260 in FIG. 11. (Of course, any other suitable tri-state driver can be used instead if desired.) Data is applied to input terminal TRIIN, and a driver-enabling signal is applied to terminal RSELTRI (e.g., from a programmable RAM cell). If driver 350 is enabled by the latter signal, the input data is passed to output terminal TRIOUT. Driver 350 has three stages. The first stage includes P-channel transistors MP0 and MP1 and N-channel transistor MN0 connected in series between VCC (logical 1) and ground (logical 0). The TRIIN terminal is connected to the gates of MP0 and MN0. The inverted RSELTRI signal is applied to the gate of MP1. The second stage includes P-channel transistor MP2 and N-channel transistors MN1 and MN2 connected in series between VCC and ground. The RSELTRI signal is applied to the gates of MP2 and MN1. The signal between MP0 and MP1 is applied between MP2 and MN1, as well as to the gate of third stage P-channel transistor MP3. The signal between MP1 and MN0 is applied between MN1 and MN2, as well as to the gate of third stage N-channel transistor MN3. MP3 and MN3 are connected in series between VCC and ground. The node between MP3 and MN3 is TRIOUT.

Although the use of tri-state drivers is preferred for elements such as 256 and 260 in FIG. 11, in some embodiments of the invention it may be possible to employ simple buffers instead.

It will be understood that the foregoing is merely illustrative of the principles of this invention, and that various modifications can be made by those skilled in the art without departing from the scope and spirit of the invention. For example, the number of logic elements in each LAB can be altered if desired. Similarly, the number of LABS can be varied, as can the numbers of the various types of conductors and inter-conductor connections. Also, the number of look-up table inputs is arbitrary and can be made more or less than four if desired. As still another example of modifications with the scope of this invention, any of the techniques shown in FIGS. 5–9 can be used to facilitate providing conductor interconnections of the type indicated, for example, at 231, 249, and 253 in FIG. 11 herein.

What is claimed is:

1. A logic device comprising:

a plurality of logic blocks containing multiple logic elements, the logic blocks arranged in an array of rows and columns;

first set of conductors extending in a first dimension;

second set of conductors extending in a second dimension; and a set of input conductors associated with each logic block, each set of input conductors supplying signals to the logic elements of the associated logic block, such that at least one of the input conductors supplies inputs to more than one of the logic elements in the associated logic block.

2. The device defined in claim 1 wherein the input conductors associated with each of the logic blocks receive signals from the first set of conductors.

3. The device defined in claim 2 wherein at least some of the logic elements output signals to the first set of conductors.

4. The device defined in claim 3 wherein at least some of the logic elements output signals to the second set of conductors.

5. The device defined in claim 2 wherein a subset of the first set of conductors is associated with a row of logic blocks, wherein the input conductors associated with each of the logic blocks in that row receive signals from the subset of the first set of conductors associated with that row.

6. The device of claim 5, wherein the input conductors associated with a row of logic blocks can only receive signals directly from the first set of conductors associated with that row of logic blocks.

7. The device defined in claim 1 further comprising a plurality of local feedback conductors associated with each of the logic blocks.

8. The device defined in claim 7 wherein the local feedback conductors associated with each of the logic blocks carries a signal from one logic element to any other logic element within the same logic block.

9. The device defined in claim 1 wherein each of the logic elements comprises:

combinatorial logic circuitry; and register circuitry.

10. The device defined in claim 9 wherein at least one of the logic elements contains a bypass circuit such that the output of the combinatorial circuit can be input to the register circuitry or output to the first or second sets of conductors without passing through the register circuitry.

11. The device of claim 5, wherein a subset of the first set of conductors associated with a row of logic blocks is disposed on the device such that approximately half the conductors are arranged above and approximately half the conductors are arranged below the associated logic blocks.

12. The device of claim 1, wherein the input conductors are arranged along one side of the logic elements within one logic block.

13. The device of claim 7, wherein the local feedback conductors and the input conductors are arranged along the same side of the logic elements within one block.

14. The device of claim 1, wherein the logic block contains at least four logic elements.

15. The device of claim 14, wherein the input conductors are connected to all of the logic elements.

16. The device of claim 15, further comprising local feedback conductors capable of routing an output of each logic element to the input of each logic element in the respective logic block.

17. The device of claim 1, wherein the logic block contains at least eight logic elements.

18. The device of claim 17, wherein each logic element contains a look-up table capable of implementing any function of at least four inputs.

19. The device of claim 1, wherein substantially all of the first set of conductors extend substantially along the entire length of the first dimension.

20. The device defined in claim 19, wherein substantially all of the second set of conductors extend substantially along the entire length of the second dimension.

21. The device defined in claim 1, further comprising:

a carry signal conductor extending from each logic element to another logic element.

22. The device defined in claim 1, further comprising:

a cascade signal conductor extending from each logic element to another logic element.

23. A logic device comprising:

a plurality of logic blocks containing multiple elements, the logic blocks arranged in an array on the device;

first interconnection conductors extending in a first direction;

second interconnection conductors extending in a second direction; and a plurality of local feedback conductors associated with each of the logic blocks and connected to convey an output signal from one of the logic elements in the block to an input of another logic element in the block.

24. The device defined in claim 23 wherein each of the logic elements comprises:

combinatorial logic circuitry; and register circuitry.

25. The device defined in claim 23 wherein each of the local feedback conductors associated with a logic block extends adjacent to all of the logic elements in that block.

26. The device defined in claim 23 wherein the first interconnection conductors include subsets respectively associated with rows of the logic blocks, each subset of the first interconnection conductors extends along the entire length of the associated row.

27. The device defined in claim 23 wherein the second interconnection conductors include subsets respectively associated with columns of the logic blocks, each subset of the second interconnection conductors extends along the entire length of the associated column.

28. The device defined in claim 23 wherein the output of one logic element can be connected to multiple ones of the first and second interconnection conductors.

29. The device defined in claim 23 further comprising:

a plurality of input conductors associated with each of the blocks.

30. The device defined in claim 29 wherein an input of each logic element is selected from a signal on the input conductors and a signal on the local feedback conductors associated with the block that includes that logic element.

31. The device defined in claim 29 wherein the input conductors are coupled to either the first interconnection conductors or the second interconnection conductors, but not both.

32. A logic device comprising:

a plurality of blocks containing multiple logic elements;

a plurality of horizontal and vertical conductors;

a plurality of local conductors associated with each of the blocks and extending adjacent to all of the logic elements in the associated block; and a plurality of input conductors associated with each of the logic elements, connected to multiple local conductors such that the input conductors can input a signal from at least one of the local conductors of the associated block to convey a signal from one of the horizontal conductors associated with that row.

33. The device defined in claim 32 further comprising:

a plurality of local feedback conductors associated with each of the blocks and extending adjacent to all of the logic elements in that block.

34. The device defined in claim 33 wherein each input conductor can be connected to at least one local conductor and at least one local feedback conductor associated with the block that includes the logic element having that input conductor.

35. The device of claim 34, wherein each input conductor is capable of being connected to each local conductor and each local feedback conductor associated with the logic element having that input conductor.

36. The device of claim 32, wherein each of the vertical conductors can drive a signal to at least one of the horizontal conductors.

37. The device of claim 36 wherein driving a signal from a vertical conductor to a horizontal conductor makes use of output routing of a logic element.

38. The device of claim 32, wherein each of the logic elements can drive a signal to multiple horizontal and vertical conductors.

39. The device in claim 32 wherein each horizontal conductor can drive a signal to a vertical conductor only through a logic element.

40. The device defined in claim 32 further comprising fast conductors extending adjacent to substantially all of the blocks.

41. The device defined in claim 32 further comprising cascade connections extending in a chain from logic element to logic element within each of the blocks.

42. The device defined in claim 41 wherein the chain of cascade connections additionally extends from block to block.

43. The device defined in claim 32 further comprising carry connections extending in a chain from logic element to logic element within each of the blocks.

44. The device defined in claim 43 wherein the chain of carry connections additionally extends from block to block.

45. The device defined in claim 32 wherein each of the logic elements comprises:

combinatorial logic circuitry; and register circuitry.

46. The device defined in claim 32 wherein an output of at least one of the logic elements in a block is connected to one of the horizontal conductors associated with a row of blocks that includes that block.

47. The device defined in claim 32 wherein each of the logic elements comprises interconnection circuitry, and wherein the interconnection circuitry in at least one of the logic element circuits connects one of the vertical conductors to one of the horizontal conductors.

48. The device defined in claim 47 wherein the interconnection circuitry includes driver circuitry that strengthens a signal passing through the interconnection circuitry.

49. The device defined in claim 32 wherein each of the logic elements comprises driver circuitry.

50. The device defined in claim 49 wherein the driver circuitry in at least one of the logic elements is connected to strengthen an output signal of that logic element.

51. The device defined in claim 49 wherein the driver circuitry is a tristate driver that selects the output of a multiplexer.

* * * * *